(12) United States Patent  
Sugiyama et al.

(10) Patent No.: US 8,552,418 B2
(45) Date of Patent: Oct. 8, 2013

(54) SEMICONDUCTOR DEVICE AND MANUFACTURING METHOD THEREOF

(75) Inventors: Eiji Sugiyama, Tochigi (JP); Yoshitaka Dozen, Tochigi (JP); Hisashi Ohtani, Tochigi (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 280 days.

(21) Appl. No.: 13/157,338

(22) Filed: Jun. 10, 2011

(65) Prior Publication Data

US 2011/0233556 A1   Sep. 29, 2011

Related U.S. Application Data

(63) Continuation of application No. 12/073,617, filed on Mar. 7, 2008, now Pat. No. 7,968,427.

(30) Foreign Application Priority Data

Mar. 13, 2007 (JP) ................................ 2007-064051

(51) Int. Cl.
*H01L 35/24* (2006.01)

(52) U.S. Cl.
USPC ............. 257/40; 257/66; 257/72; 257/347; 257/679; 257/789; 257/E27.1

(58) Field of Classification Search
USPC ............ 257/40, 66, 72, 347, 506, 531, 679, 257/789, E27.1
See application file for complete search history.

(56) References Cited

U.S. PATENT DOCUMENTS

| 5,075,166 A | 12/1991 | Sikorski et al. |
| 5,442,198 A | 8/1995 | Arai et al. |
| 5,597,631 A | 1/1997 | Furumoto et al. |
| 5,757,456 A | 5/1998 | Yamazaki et al. |

(Continued)

FOREIGN PATENT DOCUMENTS

| CN | 1370389 | 9/2002 |
| CN | 1822351 | 8/2006 |

(Continued)

OTHER PUBLICATIONS

Search Report (Application No. 08003899.5) dated Apr. 6, 2009.

(Continued)

*Primary Examiner* — Jack Chen
(74) *Attorney, Agent, or Firm* — Eric J. Robinson; Robinson Intellectual Property Law Office, P.C.

(57) ABSTRACT

The present invention provides a semiconductor device which is not easily damaged by external local pressure. The present invention further provides a method for manufacturing a highly-reliable semiconductor device, which is not destructed by external local pressure, with a high yield. A structure body, in which high-strength fiber of an organic compound or an inorganic compound is impregnated with an organic resin, is provided over an element layer having a semiconductor element formed using a non-single crystal semiconductor layer, and heating and pressure bonding are performed, whereby a semiconductor device is manufactured, to which the element layer and the structure body in which the high-strength fiber of an organic compound or an inorganic compound is impregnated with the organic resin are firmly fixed together.

23 Claims, 16 Drawing Sheets

(56) References Cited

U.S. PATENT DOCUMENTS

| | | |
|---|---|---|
| 5,770,313 A | 6/1998 | Furumoto et al. |
| 5,821,138 A | 10/1998 | Yamazaki et al. |
| 5,879,502 A | 3/1999 | Gustafson |
| 5,888,609 A | 3/1999 | Karttunen et al. |
| 6,224,965 B1 | 5/2001 | Haas et al. |
| 6,403,221 B1 | 6/2002 | Nakamura et al. |
| 6,476,330 B2 | 11/2002 | Otsuka et al. |
| 6,482,495 B1 | 11/2002 | Kohama et al. |
| 6,530,147 B1 | 3/2003 | Haas et al. |
| 6,677,183 B2 | 1/2004 | Sakaguchi et al. |
| 6,805,958 B2 | 10/2004 | Nakamura et al. |
| 6,903,377 B2 | 6/2005 | Yamazaki et al. |
| 6,926,794 B2 | 8/2005 | Kohama et al. |
| 6,972,215 B2 | 12/2005 | Sakaguchi et al. |
| 7,045,442 B2 | 5/2006 | Maruyama et al. |
| 7,049,178 B2 | 5/2006 | Kim et al. |
| 7,061,083 B1 | 6/2006 | Usami et al. |
| 7,067,392 B2 | 6/2006 | Yamazaki et al. |
| 7,230,316 B2 | 6/2007 | Yamazaki et al. |
| 7,262,464 B2 | 8/2007 | Takafuji et al. |
| 7,407,870 B2 | 8/2008 | Maruyama et al. |
| 7,465,674 B2 | 12/2008 | Tamura et al. |
| 7,465,677 B2 | 12/2008 | Isobe et al. |
| 7,470,461 B2 | 12/2008 | Jang et al. |
| 7,485,489 B2 | 2/2009 | Björbell |
| 7,495,256 B2 | 2/2009 | Yamazaki et al. |
| 7,576,362 B2 | 8/2009 | Takayama et al. |
| 7,667,310 B2 | 2/2010 | Dozen et al. |
| 7,685,706 B2 | 3/2010 | Maruyama et al. |
| 7,700,463 B2 | 4/2010 | Shimomura |
| 7,709,883 B2 | 5/2010 | Takano et al. |
| 7,718,547 B2 | 5/2010 | Isobe et al. |
| 7,727,859 B2 | 6/2010 | Watanabe et al. |
| 7,736,958 B2 | 6/2010 | Dozen et al. |
| 7,736,964 B2 | 6/2010 | Yamamoto et al. |
| 7,759,788 B2 | 7/2010 | Aoki et al. |
| 7,785,933 B2 | 8/2010 | Dozen et al. |
| 7,968,427 B2 | 6/2011 | Sugiyama et al. |
| 8,026,152 B2 | 9/2011 | Yamazaki et al. |
| 8,044,397 B2 | 10/2011 | Takayama et al. |
| 8,288,773 B2 | 10/2012 | Dairiki et al. |
| 2003/0032210 A1 | 2/2003 | Takayama et al. |
| 2004/0016118 A1 | 1/2004 | Haas et al. |
| 2004/0142154 A1* | 7/2004 | Tomekawa et al. ............ 428/209 |
| 2005/0233122 A1 | 10/2005 | Nishimura et al. |
| 2009/0065590 A1 | 3/2009 | Aoki et al. |
| 2009/0152539 A1 | 6/2009 | Yamazaki et al. |
| 2010/0237354 A1 | 9/2010 | Yamamoto et al. |
| 2012/0007159 A1 | 1/2012 | Yamazaki et al. |
| 2012/0018729 A1 | 1/2012 | Takayama et al. |
| 2012/0322212 A1 | 12/2012 | Dairiki et al. |

FOREIGN PATENT DOCUMENTS

| | | |
|---|---|---|
| EP | 1092739 | 4/2001 |
| EP | 1229581 A | 8/2002 |
| EP | 1434263 A | 6/2004 |
| EP | 1589797 | 10/2005 |
| EP | 1717847 A | 11/2006 |
| EP | 1970951 A | 9/2008 |
| JP | 05-190582 | 7/1993 |
| JP | 05-286065 A | 11/1993 |
| JP | 08-250745 | 9/1996 |
| JP | 08-288522 | 11/1996 |
| JP | 10-501475 | 2/1998 |
| JP | 10-092980 | 4/1998 |
| JP | 10-129165 A | 5/1998 |
| JP | 2001-331120 | 11/2001 |
| JP | 2002-231912 A | 8/2002 |
| JP | 1370389 | 9/2002 |
| JP | 2003-049388 A | 2/2003 |
| JP | 2003-174153 | 6/2003 |
| JP | 2004-078991 | 3/2004 |
| JP | 2004-140267 A | 5/2004 |
| JP | 2004-221561 A | 8/2004 |
| JP | 2004-221570 A | 8/2004 |
| JP | 2004-281182 A | 10/2004 |
| JP | 2004-362341 | 12/2004 |
| JP | 2006-093678 A | 4/2006 |
| JP | 2006-135305 A | 5/2006 |
| JP | 2006-173596 A | 6/2006 |
| JP | 2006-332634 A | 12/2006 |
| JP | 2007-013128 A | 1/2007 |
| JP | 2008-257710 A | 10/2008 |
| WO | WO 96/09158 | 3/1996 |
| WO | WO 01/01740 | 1/2001 |
| WO | WO 04/001848 | 12/2003 |
| WO | 2004/036652 | 4/2004 |
| WO | WO 2004/036652 | 4/2004 |
| WO | WO-2006/022169 | 3/2006 |

OTHER PUBLICATIONS

Chinese Office Action (Application No. 200810086420.0) dated Feb. 12, 2011.

Taiwanese Office Action (Application No. 97108344) Dated Jun. 27, 2013.

* cited by examiner

511

501

512

501

514  513
514      501
         501
                515

516

501

517

501

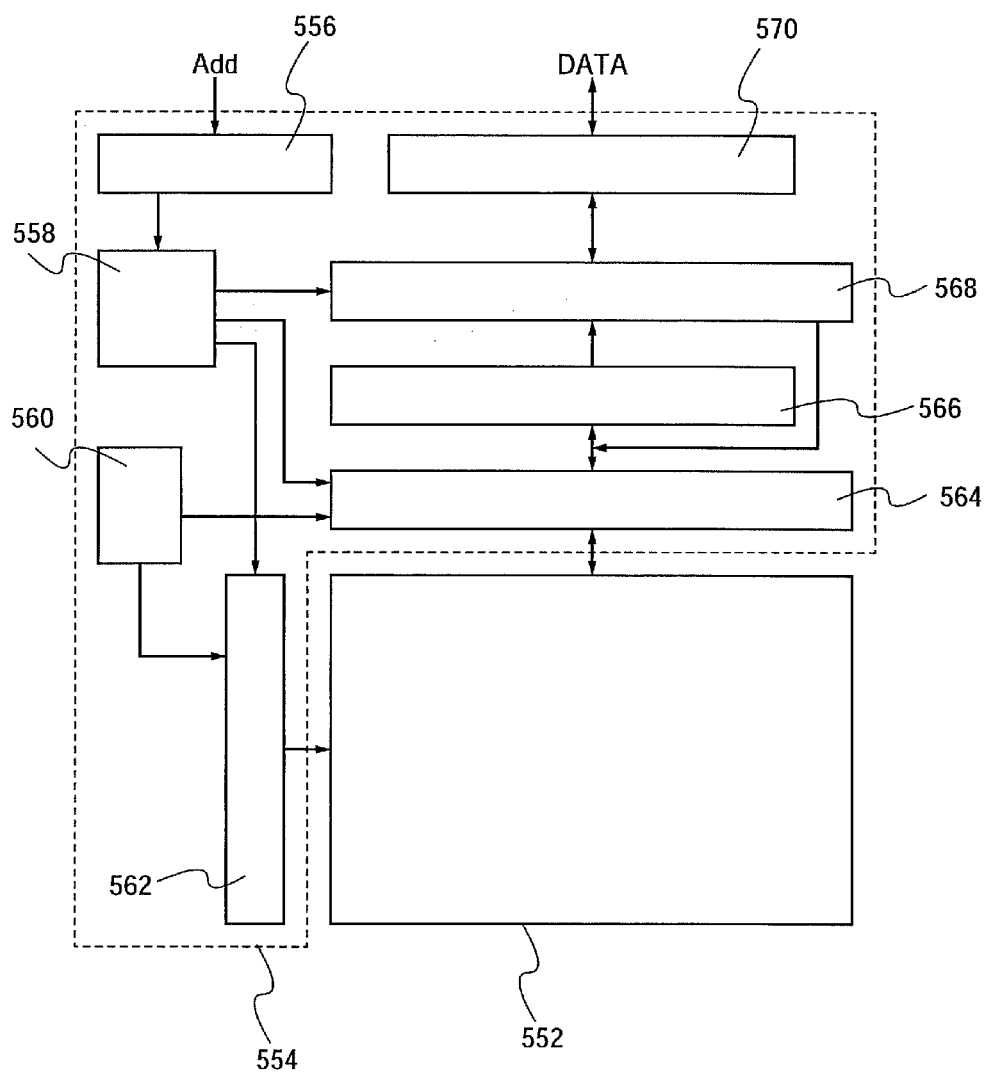

SEMICONDUCTOR DEVICE AND MANUFACTURING METHOD THEREOF

BACKGROUND OF THE INVENTION

1. Field of the Invention

The present invention relates to a semiconductor device having a semiconductor element using a non-single crystal semiconductor layer and a manufacturing method of the semiconductor device.

2. Description of the Related Art

Currently, it is important to make various devices, such as wireless chips and sensors, into a thinner shape in miniaturizing products, and the technique and the application range spread rapidly. Such various devices which are made thin are flexible to some extent and thus the devices can be provided for an object having a curved surface.

Therefore, a technique of manufacturing a semiconductor device is proposed, in which an element layer including a thin film transistor which is formed over a glass substrate is separated from the substrate and transferred to another substrate, for example, a plastic film or the like.

The present applicant proposes techniques of separation and transfer, which are mentioned in Patent Document 1 (Japanese Published Patent Application No. H8-288522) and Patent Document 2 (Japanese Published Patent Application No. H8-250745). In Patent Document 1, a technique is described in which separation is performed by removing a silicon oxide layer, which is to be a separation layer, by wet etching. In Patent Document 2, a technique is described in which separation is performed by removing a silicon layer, which is to be a separation layer, by dry etching.

Further, the present applicant proposes techniques of separation and transfer, which is mentioned in Patent Document 3 (Japanese Published Patent Application No. 2003-174153). In Patent Document 3, a technique is described in which, in forming a metal layer (Ti, Al, Ta, W, Mo, Cu, Cr, Nd, Fe, Ni, Co, Ru, Rh, Pd, Os, or Ir) over a substrate and stacking an oxide layer thereover, a metal oxide layer of the metal layer is formed at the interface between the metal layer and an oxide layer, and the metal oxide layer is utilized for separation in a subsequent step.

In Patent Document 4 (Japanese Published Patent Application No. 2004-78991), a semiconductor device is disclosed in which, a semiconductor chip with the size of less than or equal to 0.5 mm is embedded in a paper- or film-like medium, so that tolerance for bending and concentrated loading is improved.

SUMMARY OF THE INVENTION

However, in the case of a semiconductor device with a built-in (on-chip) antenna which is incorporated in a chip, the size of the antenna is small when the size of the chip is small, leading to a problem of a short communication distance. In the case where a semiconductor device is manufactured by connecting to a chip an antenna provided for a paper medium or a film medium, a poor connection is made when the size of the chip is small.

Accordingly, it is conceivable that the size of a chip itself is increased in order to prevent a poor connection or reduction of a communication range. However, when the area of a chip is enlarged, a semiconductor device which is transferred to a plastic film or the like and thus manufactured is cracked by external local pressure, resulting in an operation defect. For example, when a character is written with a writing material on a plastic sheet or paper on a surface of a semiconductor device, writing pressure is applied to the semiconductor device, leading to a problem of destruction of the semiconductor device. Further, when a semiconductor device is manufactured by a roll-to-roll method, linear pressure is applied to a region interposed between rolls, leading to a problem of destruction of the semiconductor device.

Accordingly, the present invention provides a semiconductor device which is not easily damaged by external local pressure. The present invention further provides a method for manufacturing a highly-reliable semiconductor device, which is not destructed by external local pressure, with a high yield.

According to one aspect of the present invention, a structure body, in which a fibrous body of an organic compound or an inorganic compound is impregnated with an organic resin, is provided over an element layer having a semiconductor element formed using a non-single crystal semiconductor layer, and heating and pressure bonding are performed, whereby a semiconductor device is manufactured, to which the element layer and the structure body in which the fibrous body of an organic compound or an inorganic compound is impregnated with the organic resin are firmly fixed (bonded) together.

According to another aspect of the present invention, a separation layer is formed over a substrate having an insulating surface, an element layer having a semiconductor element formed using a non-single crystal semiconductor layer is formed over the separation layer, and a structure body in which a fibrous body of an organic compound or an inorganic compound is impregnated with an organic resin is provided over the element layer, and heating and pressure bonding are performed, whereby a sealing layer in which the fibrous body of an organic compound or an inorganic compound is impregnated with the organic resin is provided over the element layer, and the element layer is separated from the separation layer, and thus, a semiconductor device is manufactured.

A semiconductor device of the present invention is a semiconductor device including an element layer having a semiconductor element formed using a non-single crystal semiconductor layer, and a sealing layer which is in contact with the element layer and alleviates local pressure. By the organic resin, the element layer and a fibrous body are firmly fixed together, and further, the fibrous body is impregnated with the organic resin.

Another semiconductor device of the present invention is a semiconductor device including an element layer having a semiconductor element formed using a non-single crystal semiconductor layer, a fibrous body using fiber of an organic compound or an inorganic compound, and an organic resin by which the element layer and the fibrous body are firmly fixed together. By the organic resin, the element layer and the fibrous body are firmly fixed together, and further, the fibrous body is impregnated with the organic resin.

Another semiconductor device of the present invention is a semiconductor device including an element layer having a semiconductor element formed using a non-single crystal semiconductor layer, a fibrous body using fiber of an organic compound or an inorganic compound, and a sealing layer including an organic resin with which the fibrous body is impregnated.

The thickness of the element layer is preferably greater than or equal to 1 μm and less than or equal to 10 μm, more preferably greater than or equal to 1 μm and less than or equal to 5 μm. The thickness of the sealing layer is preferably greater than or equal to 10 μm and less than or equal to 100

µm. When the sealing layer is formed to such a thickness, a semiconductor device capable of being curved can be manufactured.

The fibrous body is a woven fabric or a nonwoven fabric which uses high-strength fiber of an organic compound or an inorganic compound. The high-strength fiber is specifically fiber with a high modulus of elongation or fiber with a high Young's modulus.

Further, as the organic resin, a thermoplastic resin or a thermosetting resin can be used.

By using high-strength fiber as the fibrous body, even when local pressure is applied to a semiconductor device, the pressure is dispersed throughout the fibrous body; accordingly, partial stretching of the semiconductor device can be prevented. That is, destruction of a wiring, a semiconductor element, or the like which is caused by partial stretching thereof, can be prevented.

According to the present invention, a highly-reliable semiconductor device which is not easily damaged by external local pressure can be manufactured.

BRIEF DESCRIPTION OF THE DRAWINGS

FIG. 14 is a diagram illustrating a semiconductor device of the present invention;

DETAILED DESCRIPTION OF THE INVENTION

Embodiment Mode

Figure 1A:
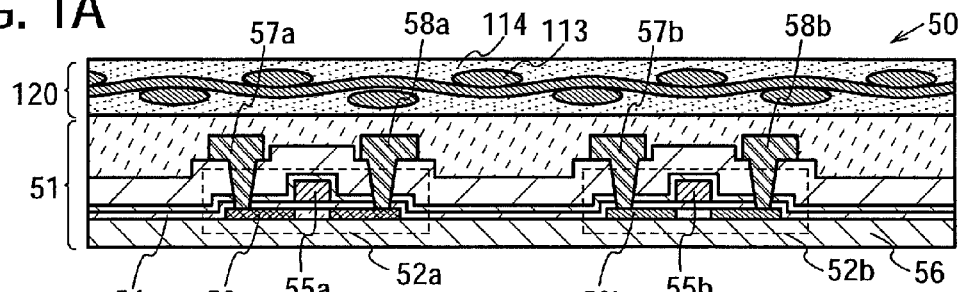
FIGS. 1A to 1E are cross-sectional views illustrating a semiconductor device of the present invention.

Embodiment modes and an embodiment of the present invention will be explained below with reference to the accompanied drawings. However, the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of the embodiment modes and embodiment below. It is to be noted that the same portion or a portion having the same function are denoted by the same reference numerals through different drawings for illustrating the embodiment modes and embodiment.

Embodiment Mode 1

This embodiment mode describes a highly-reliable semiconductor device which is not easily damaged by local pressure (point pressure, linear pressure, or the like), with reference to FIGS. 1A to 1E, FIGS. 8A and 8B, and FIGS. 9A to 9D.

One aspect of a semiconductor device of this embodiment mode is that, over an element layer including a semiconductor element formed using a non-single crystal semiconductor layer, a sealing layer including a fibrous body of an organic compound or an inorganic compound and an organic resin with which the fibrous body is impregnated is formed.

As typical examples of the semiconductor element formed using a non-single crystal semiconductor layer which is included in the element layer, an active element such as a thin film transistor, a diode, or a nonvolatile memory element, and a passive element such as a resistor element or a capacitor element can be given. As the non-single crystal semiconductor layer, a crystalline semiconductor layer, an amorphous semiconductor layer, a microcrystalline semiconductor layer, or the like can be given. As the semiconductor, silicon, germanium, a silicon germanium compound, or the like can be given. Further, as the semiconductor, a metal oxide can be used, and typically, a zinc oxide, an oxide of zinc gallium indium, or the like can be given. Furthermore, as the semiconductor, an organic semiconductor material can be used. The thickness of the element layer is preferably greater than or equal to 1 µm and less than or equal to 10 µm, more preferably greater than or equal to 1 µm and less than or equal to 5 µm. When the element layer is formed to such a thickness, a semiconductor device capable of being curved can be manufactured. The area of a top surface of the semiconductor device is preferably greater than or equal to 4 mm$^2$, more preferably greater than or equal to 9 mm$^2$.

FIGS. 1A to 1E are cross-sectional views of a semiconductor device of this embodiment mode.

In a semiconductor device 50 shown in FIG. 1A, a fibrous body 113 is firmly fixed to one surface of an element layer 51 including thin film transistors 52a and 52b, by an organic resin 114. Here, the fibrous body 113 which is firmly fixed to the element layer 51, and the organic resin 114 are collectively referred to as a sealing layer 120. The sealing layer 120 is provided so as to cover a semiconductor element formed in the element layer. As a typical example of such a semiconductor device 50, a microprocessor (MPU) which controls other devices or calculates and processes data can be given. An MPU includes a CPU, a main memory, a controller, an interface, an I/O port, and the like, and each of them can be formed using a thin film transistor, a resistor element, a capacitor element, a wiring, or the like.

Figure 1B:
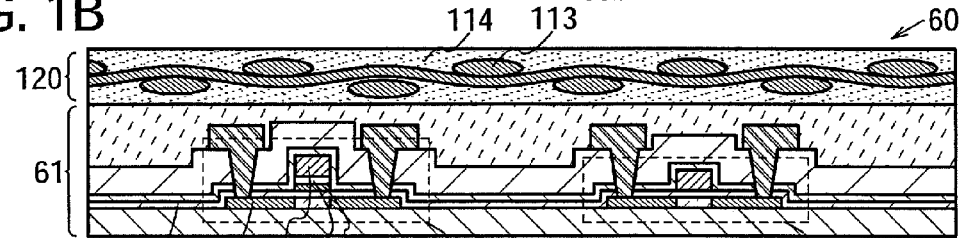

In a semiconductor device 60 shown in FIG. 1B, a fibrous body 113 is firmly fixed to one surface of an element layer 61 including a memory element 62 and a thin film transistor 52b, by an organic resin 114. As the memory element, a nonvolatile memory element including a floating gate or a charge storage layer; a thin film transistor and a capacitor element connected to the thin film transistor; a thin film transistor and a capacitor element including a ferroelectric layer which is connected to the thin film transistor, an organic memory element in which an organic compound layer is interposed between a pair of electrodes; or the like can be given. As semiconductor devices having such memory elements, memory devices such as DRAM (Dynamic Random Access Memory), SRAM (Static Random Access Memory), FeRAM (Ferroelectric Random Access Memory), mask ROM (Read Only Memory), EPROM (Electrically Programmable Read Only Memory), EEPROM (Electrically Erasable and Programmable Read Only Memory), and flash memory can be given. Here, a nonvolatile memory element including a floating gate electrode 63 is shown as the memory element 62.

Figure 1C:
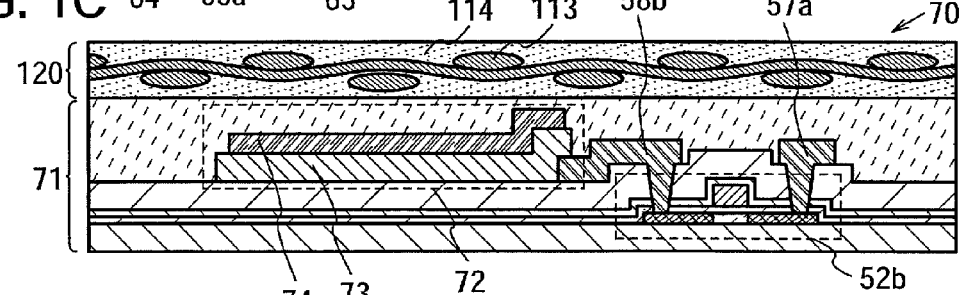

In a semiconductor device 70 shown in FIG. 1C, a fibrous body 113 is firmly fixed to one surface of an element layer 71 including a diode 72 and a thin film transistor 52b, by an organic resin 114. As the diode, a diode using amorphous silicon, a diode using a crystalline silicon layer, or the like can be given. As semiconductor devices having such diodes, an optical sensor, a solar cell, and the like can be given. Here, a diode using amorphous silicon is shown as the diode 72.

Figure 1D:
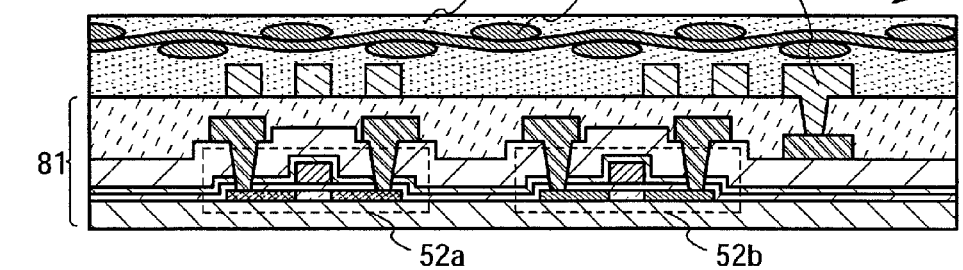

In a semiconductor device 80 shown in FIG. 1D, a fibrous body 113 is firmly fixed to one surface of an element layer 81 including thin film transistors 52a and 52b and an antenna 83 electrically connected to the thin film transistors 52a and 52b, by an organic resin 114. As typical examples of such a semiconductor device, an ID tag, an IC tag, an RF (radio frequency) tag, a wireless tag, an electronic tag, an RFID (radio frequency identification) tag, an IC card, an ID card, and the like, which can transmit and receive information wirelessly (hereinafter, referred to as an RFID) can be given. Further, a semiconductor device of the present invention includes an inlay in which an integrated circuit portion including a thin film transistor and the like and an antenna are sealed; and the inlay formed into a seal or card shape. Further, when the area of a top surface of the semiconductor device 80 is greater than or equal to 4 mm$^2$, more preferably greater than or equal to 9 mm$^2$, the antenna can be formed to have a large area. Accordingly, an RFID with a long communication distance from a communication instrument can be obtained.

Further, in addition to one surface of each of the element layers shown in FIGS. 1A to 1D, the fibrous body 113 may also be firmly fixed to the opposite surface by the organic resin. That is, opposing surfaces of the element layer may each be provided with a sealing layer; thus, a pair of opposing sealing layers may be provided so as to cover a semiconductor element, which is formed in the element layer, from opposing sides. In a semiconductor device 90 shown in FIG. 1E, a sealing layer 120a is formed on one surface of an element layer 51 of the semiconductor device shown in FIG. 1A, and a sealing layer 120b is formed on the opposite surface of the element layer 51. The sealing layers 120a and 120b at this time are preferably formed from the same fibrous body and organic resin in order to reduce warpage. However, in the case of a use in which the front and the rear are distinguished from each other, it is not necessary that the sealing layers 120a and 120b are formed from the same materials. In such a manner, the organic resin with which the fibrous body is impregnated is firmly fixed, whereby opposing surfaces of the element layer are supported by the fibrous body. Therefore, reduction of warpage of the semiconductor device is possible, which makes it easy to mount the semiconductor device on a laminate film, a seal, or the like.

The fibrous body 113 provided over one surface or opposing surfaces of the element layer is a woven fabric or a nonwoven fabric which uses high-strength fiber of an organic compound or an inorganic compound, and the fibrous body 113 covers an entire surface of the element layer. High-strength fiber is specifically fiber with a high modulus of elongation or fiber with a high Young's modulus. As typical examples of high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, glass fiber using E glass, S glass, D glass, Q glass, or the like can be used. It is to be noted that the fibrous body 113 may be formed from one or more kinds of the above-described high-strength fiber.

The fibrous body 113 may be formed using a woven fabric which is woven using bundles of fiber (single yarn) (hereinafter, referred to as yarn bundles) for warp yarns and weft yarns, or a nonwoven fabric obtained by stacking yarn bundles of plural kinds of fiber in a random manner or in one direction. In the case of a woven fabric, a plain-woven fabric, a twilled fabric, a satin-woven fabric, or the like can be appropriately used.

The yarn bundle may have a circular shape or an elliptical shape in cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which is subjected to fabric opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in cross section. Use of a yarn bundle having an elliptical shape or a flat shape in cross section in this manner can make a thickness of the fibrous body 113 small. Accordingly, the thickness of a structure body 115 can be made small, and a thin semiconductor device can be manufactured. An effect of the present invention is observed when the width of the yarn bundle is greater than or equal to 4 μm and less than or equal to 400 μm, more preferably greater than or equal to 4 μm and less than or equal to 200 μm. Theoretically, the width of the yarn bundle may be even narrower than that. An effect of the present invention is observed when the thickness of the yarn bundle is greater than or equal to 4 μm and less than or equal to 20 μm. Theoretically, the thickness of the yarn bundle may be even smaller than that. The width and the thickness depend on a material of fiber.

In the drawings of this specification, the fibrous body 113 is shown as a woven fabric which is plain-woven using a yarn bundle having an elliptical shape in cross section. Although the size of the thin film transistors 52a and 52b is larger than that of a yarn bundle of the fibrous body 113, the size of the thin film transistors 52a and 52b may be smaller than that of a yarn bundle of the fibrous body 113.

Figure 8A:
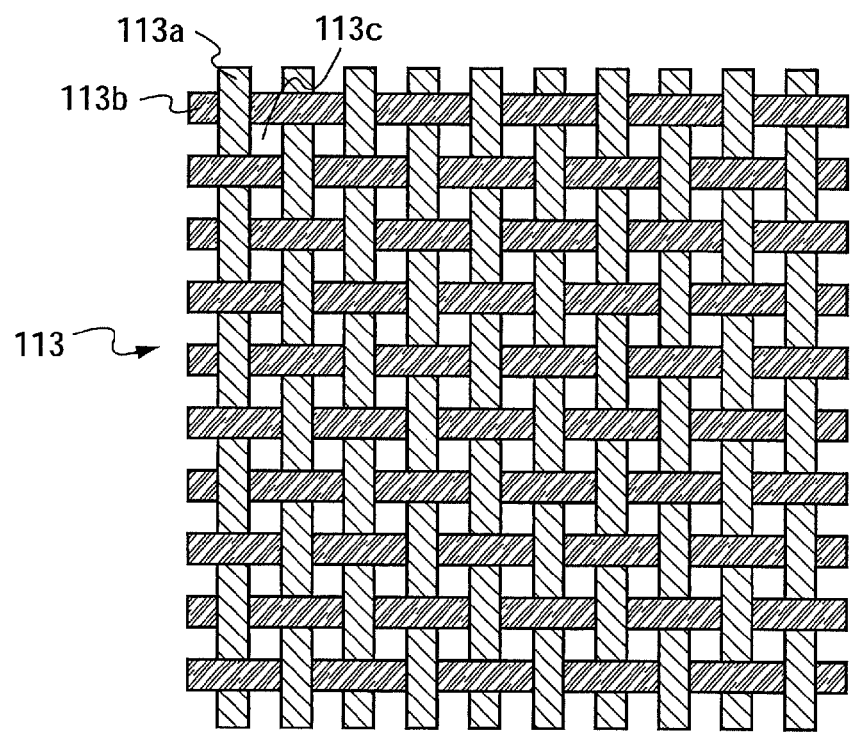
FIGS. 8A and 8B are top views each illustrating a fibrous body which can be applied to the present invention.
Figure 8B:
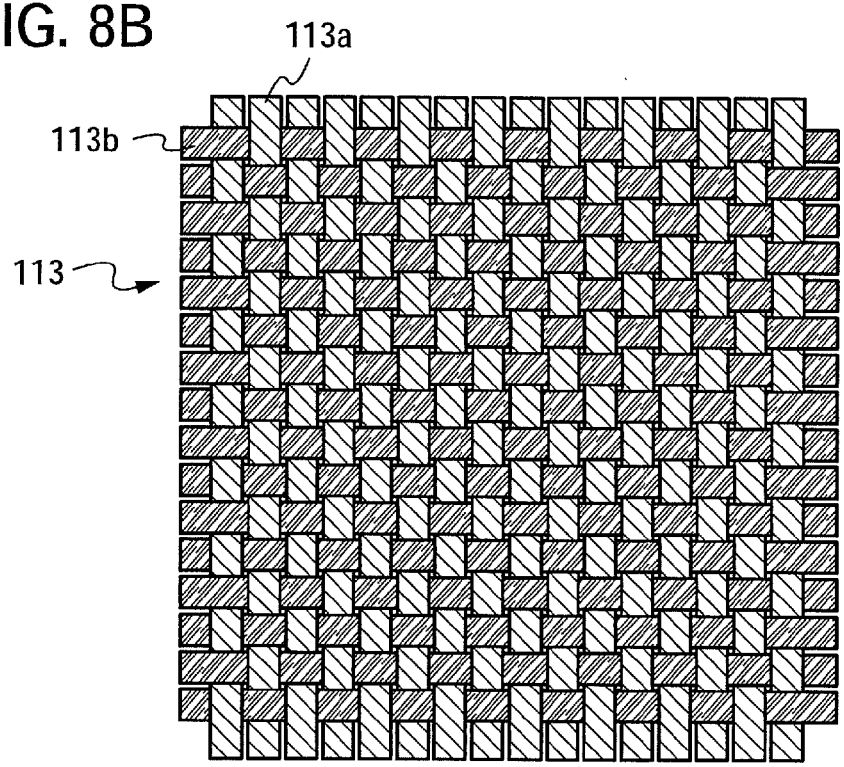
Figure 9A:
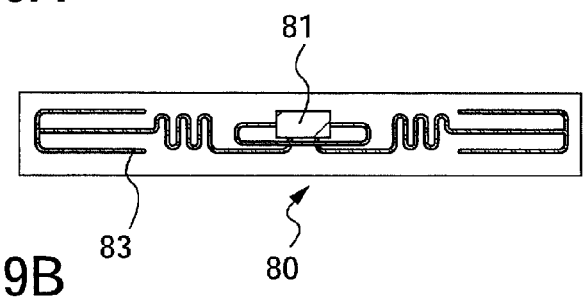
FIGS. 9A to 9D are top views each illustrating an antenna which can be applied to the present invention.
Figure 9B:
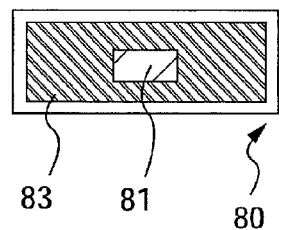
Figure 9C:
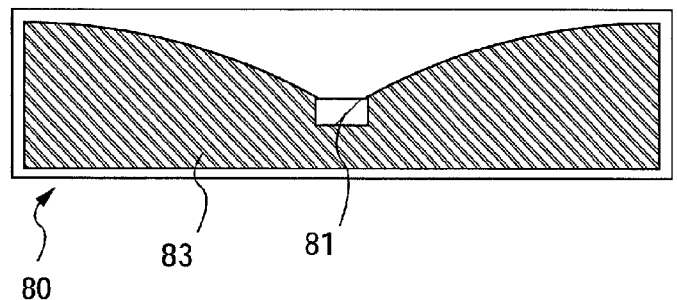
Figure 9D:
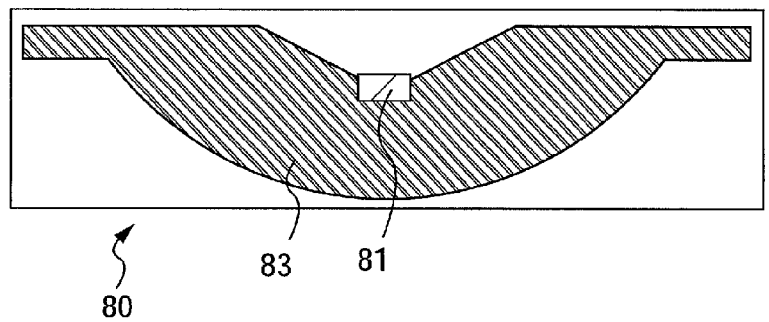

FIGS. 8A and 8B each show a top view of a woven fabric as the fibrous body 113 which is woven using yarn bundles for warp yarns and weft yarns.

As shown in FIG. 8A, the fibrous body 113 is woven using warp yarns 113a spaced at regular intervals and weft yarns 113b spaced at regular intervals. Such a fibrous body has a region without the warp yarns 113a and the weft yarns 113b (referred to as a basket hole 113c). In such a fibrous body 113, the fibrous body is further impregnated with an organic resin, whereby adhesiveness between the fibrous body 113 and the element layer can be further increased.

As shown in FIG. 8B, in the fibrous body 113, density of the warp yarns 113a and the weft yarns 113b may be high and a proportion of the basket holes 113c may be low. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. When the basket hole 113c of the fibrous body 113 has such a small area, even when pressure is applied by a member with a sharp tip (typically, a writing material such as a pen or a pencil), the pressure can be absorbed in the entire fibrous body 113.

Further, in order to enhance permeability of an organic resin into the inside of the yarn bundle, the yarn bundle may be subjected to surface treatment. For example, as the surface treatment, corona discharge, plasma discharge, or the like for activating a surface of the yarn bundle can be given. Further, surface treatment using a silane coupling agent or a titanate coupling agent can be given.

As the organic resin 114 with which the fibrous body 113 is impregnated and the surface of the element layer is sealed, a thermosetting resin such as an epoxy resin, an unsaturated polyester resin, a polyimide resin, a bismaleimide-triazine resin, or a cyanate resin can be used. Further, a thermoplastic resin such as a polyphenylene oxide resin, a polyetherimide resin, or a fluorine resin can be used. Furthermore, a plurality of the above-described thermosetting resin and thermoplastic resin may be used. When the above-described organic resin is used, the fibrous body can be firmly fixed to the element layer by thermal treatment. The higher the glass transition temperature of the organic resin 114, the harder the organic resin 114 is destructed by local pressure, which is preferable.

The thickness of the sealing layer 120 is preferably greater than or equal to 10 μm and less than or equal to 100 μm, more preferably greater than or equal to 10 μm and less than or equal to 30 μm. When a structure body with such a thickness is used, a thin semiconductor device capable of being curved can be manufactured.

Highly thermally-conductive filler may be dispersed in the organic resin 114 or the yarn bundle. As the highly thermally-conductive filler, an aluminum nitride, a bromine nitride, a silicon nitride, alumina, or the like can be given. As the highly thermally-conductive filler, a metal particle such as silver or copper can also be given. When the conductive filler is included in the organic resin or the yarn bundle, heat generated in the element layer can be easily released to the outside. Accordingly, thermal storage of the semiconductor device can be suppressed, and destruction of the semiconductor device can be reduced.

Figure 1E:
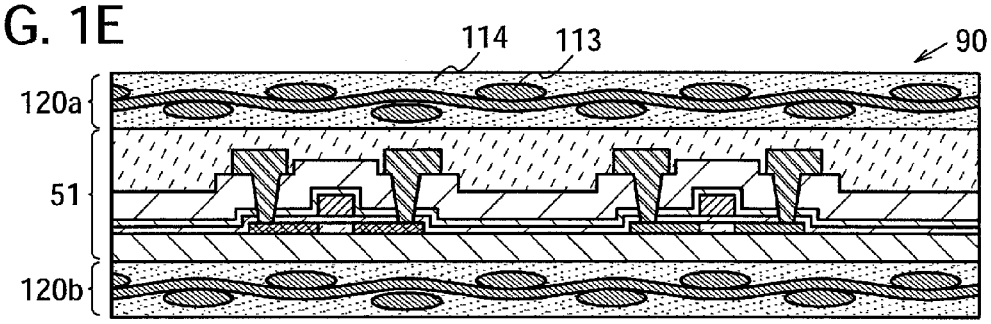

In FIG. 1E, the direction of the warp yarn or the weft yarn of the fibrous body of the sealing layer 120a formed over the element layer 51 and the direction of the warp yarn or the weft yarn of the fibrous body of the sealing layer 120b may be shifted from each other by 30° or more and 60° or less, more preferably 40° or more and 50° or less. In this case, since stretching directions of the fibrous bodies provided on the front and the rear of the element layer are different from each other, stretching due to local pressure is isotropic. Thus, destruction by local pressure can be further reduced.

Here, an effect of the semiconductor device in this embodiment mode is described with reference to FIGS. 2A to 2D.

Figure 2A:
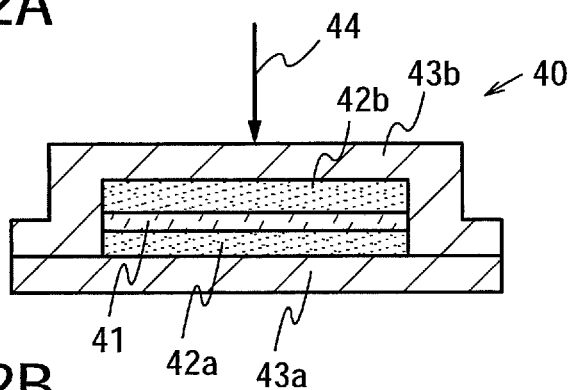
FIGS. 2A to 2D are cross-sectional views illustrating a manufacturing method of a semiconductor device of the present invention.

As shown in FIG. 2A, in a conventional semiconductor device 40, an element layer 41 including a semiconductor element formed using a non-single crystal semiconductor layer is sealed with films 43a and 43b with the use of adhesive members 42a and 42b. Local pressure 44 is applied to a semiconductor device having such a structure.

Figure 2B:
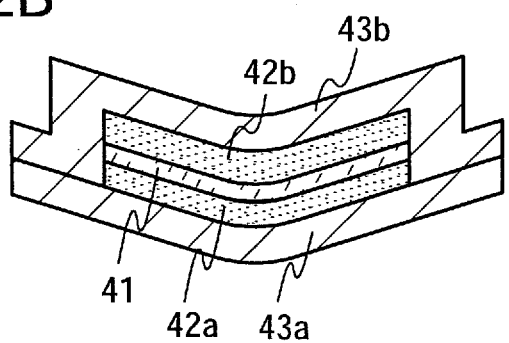

As a result, as shown in FIG. 2B, a layer which forms the element layer 41, the adhesive members 42a and 42b, and the films 43a and 43b are each stretched, and a curve with a small radius of curvature is generated in the pressed portion. Accordingly, the semiconductor element included in the element layer 41, a wiring, or the like are cracked, and the semiconductor device is destroyed.

Figure 2C:
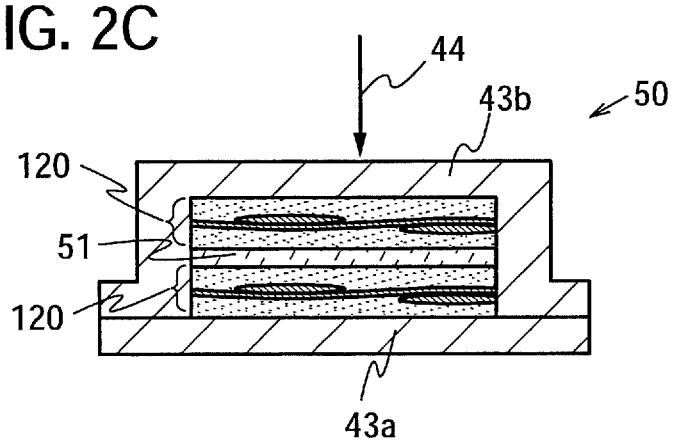
Figure 2D:
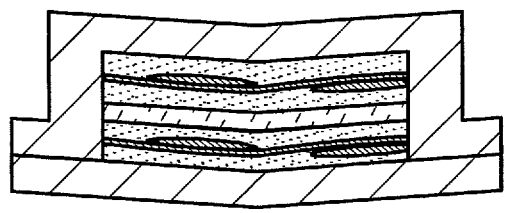

However, in a semiconductor device 50 described in this embodiment mode, as shown in FIG. 2C, a sealing layer formed of a fibrous body including an organic resin is provided on one side or opposite sides of an element layer 51. The fibrous body is formed from high-strength fiber, which has a high modulus of elasticity or a high Young's modulus. Accordingly, even when the local pressure 44 such as point pressure or linear pressure is applied, the high-strength fiber is not stretched. Pressing force is dispersed throughout the fibrous body, and the whole semiconductor device is curved. Thus, even when local pressure is applied, a curve generated in the semiconductor device has a large radius of curvature, and the semiconductor element included in the element layer 51, a wiring, and the like are not cracked, and accordingly, destruction of the semiconductor device can be reduced.

Further, when the element layer 51 is formed to have a small thickness, the semiconductor device can be curved. Accordingly, the area of the element layer 51 can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

A structure of a semiconductor element formed using a non-single crystal semiconductor layer is described below.

The thin film transistors 52a and 52b shown in FIG. 1A include semiconductor layers 53a and 53b each having a source region, a drain region, and a channel formation region; a gate insulating layer 54; and gate electrodes 55a and 55b.

The semiconductor layers 53a and 53b are layers formed using a non-single crystal semiconductor which has a thickness greater than or equal to 10 nm and less than or equal to 100 nm, more preferably greater than or equal to 20 nm and less than or equal to 70 nm. As the non-single crystal semiconductor layer, a crystalline semiconductor layer, an amorphous semiconductor layer, a microcrystalline semiconductor layer, or the like can be given. As the semiconductor, silicon, germanium, a compound of silicon and germanium, or the like can be given. In particular, it is preferable to apply a crystalline semiconductor which is formed by crystallization through rapid thermal annealing (RTA) or thermal treatment using an annealing furnace, or a crystalline semiconductor which is formed by crystallization through heat treatment and laser beam irradiation. In the heat treatment, a crystallization method using a metal element such as nickel which has an effect of promoting crystallization of a silicon semiconductor can be applied.

In the case of performing crystallization by laser light irradiation in addition to heat treatment, crystallization can be performed by continuously moving a melted zone of the crystalline semiconductor, which is melted by irradiation with a continuous wave laser beam or a high-repetition-rate ultrashort pulsed laser beam having a repetition rate of 10 MHz or higher and a pulse width of 1 nanosecond or shorter, preferably in the range of 1 to 100 picoseconds inclusive, along the laser beam irradiation direction. By such a crystallization method, a crystalline semiconductor having crystal grains which have a large grain size and have a grain boundary grown in one direction can be obtained.

The gate insulating layer 54 is formed from an inorganic insulator such as a silicon oxide and a silicon oxynitride with a thickness greater than or equal to 5 nm and less than or equal to 50 nm, preferably greater than or equal to 10 nm and less than or equal to 40 nm.

The gate electrodes 55a and 55b can be formed using metal, or a polycrystalline semiconductor to which an impurity having one conductivity type is added. In the case of using metal, tungsten (W), molybdenum (Mo), titanium (Ti), tantalum (Ta), aluminum (Al), or the like can be used. A metal nitride which is obtained by nitriding metal can also be used. Alternatively, the gate electrode may have a stacked-layer structure of a first layer made of the metal nitride and a second layer made of the metal. In that case, if the first layer is formed of a metal nitride, it can function as a barrier metal. In other words, the metal of the second layer can be prevented from diffusing into the gate insulating layer or the semiconductor layer below the gate insulating layer. In the case of employing a stacked-layer structure, the gate electrode may have a shape in which the edge of the first layer extends beyond the edge of the second layer.

The thin film transistors 52a and 52b which are formed by combination of the semiconductor layers 53a and 53b, the gate insulating layer 54, the gate electrodes 55a and 55b, and the like can have various structures such as a single drain structure, an LDD (Lightly Doped Drain) structure, and a gate overlapped drain structure. Here, a thin film transistor with a single drain structure is described. Alternatively, the thin film transistor can have a multigate structure where transistors, to which gate voltage having the same potential in terms of equivalence is applied, are connected in series, a dual gate structure where a semiconductor layer is interposed between gate electrodes, an inverted staggered structure where a gate electrode is formed over an insulating layer 56 and a gate insulating layer and a semiconductor layer are formed over the gate electrode, or the like.

Wirings 57a, 57b, 58a, and 58b which are in contact with the source region and drain region of the semiconductor layers 53a and 53b are preferably formed by combination of a low-resistance material such as aluminum (Al) and a barrier metal using a high-melting-point metal material such as titanium (Ti) or molybdenum (Mo), e.g., a stacked-layer structure of titanium (Ti) and aluminum (Al) or a stacked-layer structure of molybdenum (Mo) and aluminum (Al).

As the thin film transistor, a thin film transistor using a metal oxide or an organic semiconductor material for a semiconductor layer can be used. As typical examples of the metal oxide, a zinc oxide, an oxide of zinc gallium indium, and the like can be given.

The memory element 62 shown in FIG. 1B is a nonvolatile memory element including a semiconductor layer 53a, a tunnel oxide layer 64, a floating gate electrode 63, a control insulating layer 65, and a control gate electrode 63a.

The tunnel oxide layer 64 can be formed from a silicon oxide or formed to have a stacked-layer structure of a silicon oxide and a silicon nitride, with a thickness of 1 to 10 nm, preferably 1 to 5 nm, by a low pressure CVD method, a plasma CVD method, or the like. Further, the tunnel oxide layer can be formed by oxidizing or nitriding a semiconductor layer by plasma treatment. Furthermore, a silicon oxide formed by a plasma CVD method may be oxidized or nitrided by plasma treatment. An insulating layer formed by the plasma treatment is dense, has high withstand voltage, and is excellent in reliability.

The floating gate electrode 63 can be formed using a conductive layer, a polysilicon layer, a silicon dot, or the like. Instead of the floating gate electrode, a charge storage layer formed from a silicon nitride, a germanium nitride, or the like may be used.

The control insulating layer 65 is formed of a single layer or a plurality of layers of a silicon oxide, a silicon nitride, a silicon oxynitride, an aluminum oxide, or the like by a low pressure CVD method, a plasma CVD method, or the like. The second insulating layer 22 is formed to a thickness of 1 to 20 nm, preferably 5 to 10 nm.

The diode 72 shown in FIG. 1C includes a wiring 58b serving as a first electrode, a light receiving portion 73, and a second electrode 74. The light receiving portion can be formed of a semiconductor layer having amorphous or crystalline silicon. As typical examples of the semiconductor layer, a silicon layer, a silicon germanium layer, a silicon carbide layer, and a PN junction layer and a PIN junction layer of these layers can be given.

The antenna 83 shown in FIG. 1D is formed in such a manner that a droplet or paste which includes any one or more of metal particles of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispenser method, or the like), and it is dried and baked. When the antenna is formed by a droplet discharge method, the number of process steps can be reduced, and cost can be reduced accordingly.

Further, the antenna 83 may be formed by a screen printing method. In the case of using a screen printing method, as a material for the antenna 83, a conductive paste where conductive particles having a particle size of several nanometers to several tens of micrometers is dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersing nanoparticles can be used. In addition, as the organic resin included in the conductive paste, one or more selected from organic resins functioning as a binder, a solvent, a dispersive agent, and a coating member of the metal particles can be used. Typically, an organic resin such as an epoxy resin or a silicone resin can be given. Further, in forming the conductive layer, baking is preferably performed after the conductive paste is pushed out.

Alternatively, the antenna 83 may be formed using gravure printing or the like instead of a screen printing method or may be formed from a conductive material by a plating method, a sputtering method, or the like.

As a signal transmission method in an RFID, an electromagnetic coupling method or an electromagnetic induction method (for example, 13.56 MHz band) is applied. In the case of utilizing electromagnetic induction caused by a change in magnetic field density, the top view of the antenna can be a ring shape (for example, a loop antenna) or a spiral shape (for example, a spiral antenna).

Alternatively, a microwave method (for example, a UHF band (860 to 960 MHz band), a 2.45 GHz band, or the like) can be employed as the signal transmission method in an RFID. In that case, the length, shape, or the like of the antenna may be appropriately set in consideration of a wavelength of an electromagnetic wave used for signal transmission.

FIGS. 9A to 9D each show an example of the antenna 83 of an RFID to which a microwave method can be adapted. For example, the top view of the antenna can be a linear shape (for example, a dipole antenna (see FIG. 9A)), a flat shape (for example, a patch antenna (see FIG. 9B)), a ribbon shape (see FIGS. 9C and 9D), or the like. Further, the shape of the conductive layer serving as an antenna is not limited to a linear shape, and may be a curved shape, a meandering shape, or a shape combining these, in consideration of the wavelength of an electromagnetic wave.

In embodiment modes below, a manufacturing method of a semiconductor device described in this embodiment mode is to be described by using an RFID as an example of the semiconductor device.

Embodiment Mode 2

This embodiment mode describes a method for manufacturing a semiconductor device, which is not easily damaged by external local pressure, with a high yield with reference to FIGS. 3A to 3E.

Figure 3A:
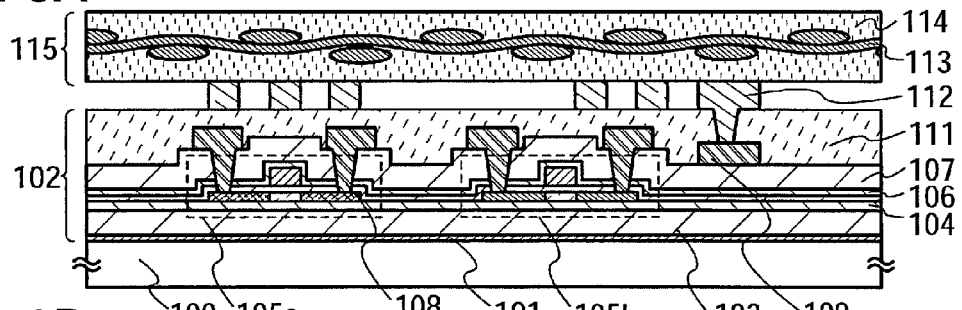
FIGS. 3A to 3E are cross-sectional views illustrating a manufacturing method of a semiconductor device of the present invention.

As shown in FIG. 3A, a separation layer 101 is formed over a substrate 100 having an insulating surface, and an element layer 102 including a semiconductor element formed using a non-single crystal semiconductor layer and an antenna 112 are formed over the separation layer 101. Then, a structure body 115 in which a fibrous body is impregnated with an organic resin is provided over the element layer 102 and the antenna 112.

As the substrate 100 having an insulating surface, a substrate which can withstand a temperature at which the element layer 102 and the antenna 112 are formed is preferably used. Typically, a glass substrate, a quartz substrate, a ceramic substrate, a metal substrate in which an insulating layer is formed at least over one surface, an organic resin substrate, or the like can be used. Here, a glass substrate is used as the substrate 100 having an insulating surface. The thickness of the element layer 102 is preferably greater than or equal to 1 µm and less than or equal to 10 µm, more preferably greater than or equal to 1 µm and less than or equal to 5 µm. When the element layer 102 is formed to such a thickness, a semiconductor device capable of being curved can be manufactured.

The separation layer 101 is formed in such a manner that a layer having a thickness of 30 to 200 nm, which is made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing any of the elements described above as its main component; or a compound material containing any of the elements described above as its main component, is formed by a sputtering method, a plasma CVD method, a coating method, a printing method, or the like to be a single layer or a stacked-layer. The crystalline structure of a layer containing silicon may be amorphous, microcrystalline, or polycrystalline. Here, a coating method refers to a method in which a solution is discharged on an object to form a film, and includes, for example, a spin coating method and a droplet discharge method. Further, a droplet discharge method is a method in which a droplet of a composition that contains fine particles is discharged through a minute hole to form a pattern with a predetermined shape.

When the separation layer 101 has a single-layer structure, it is preferably formed of a layer containing tungsten, molybdenum, or a mixture of tungsten and molybdenum. Alternatively, the separation layer 101 is formed using a layer containing an oxide of tungsten, a layer containing an oxynitride of tungsten, a layer containing an oxide of molybdenum, a layer containing an oxynitride of molybdenum, or a layer containing an oxide or an oxynitride of a mixture of tungsten and molybdenum. It is to be noted that the mixture of tungsten and molybdenum corresponds to, for example, an alloy of tungsten and molybdenum.

In the case where the separation layer 101 has a stacked-layer structure, preferably, a metal layer is formed as a first layer, and a metal oxide layer is formed as a second layer. Typically, a layer containing tungsten, molybdenum, or a mixture of tungsten and molybdenum is formed as the metal layer of the first layer. As the second layer, a layer containing an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is formed.

In the case where the separation layer 101 has a stacked-layer structure in which a metal layer is formed as the first layer and a metal oxide layer is formed as the second layer, the stacked-layer structure may be formed by utilizing the following: a layer containing tungsten is formed as the metal layer, and an insulating layer made of an oxide is formed thereover, whereby a layer containing an oxide of tungsten is formed as the metal oxide layer in the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

An oxide of tungsten is represented by $WO_x$ where x is greater than or equal to 2 and less than or equal to 3. The x may be 2 ($WO_2$), 2.5 ($W_2O_5$), 2.75 ($W_4O_{11}$), 3 ($WO_3$), and the like.

Although the separation layer 101 is formed to be in contact with the substrate 100 having an insulating surface in accordance with the above process, the present invention is not limited to the process. An insulating layer to be a base may be formed so as to be in contact with the substrate 100 having an insulating surface, and the separation layer 101 may be provided to be in contact with the insulating layer. Here, as the separation layer 101, a tungsten layer with a thickness of 30 to 70 nm is formed by a sputtering method.

Here, as a typical example of the semiconductor element formed using a non-single crystal semiconductor layer, thin film transistors 105a and 105b each having a structure similar to that of the thin film transistors 52a and 52b described in Embodiment Mode 1 are shown.

Further, here, the element layer 102 including the semiconductor element formed using a non-single crystal semiconductor layer includes the following: an insulating layer 103 serving as a buffer layer; an insulating layer 104 serving as a base layer; the thin film transistors 105a and 105b; an insulating layer 106 covering the thin film transistors 105a and 105b; an insulating layer 107 covering the insulating layer 106; a wiring 108 and a wiring 109 which are connected to a source region and a drain region of a semiconductor layer of the thin film transistor through the insulating layers 106 and 107; an insulating layer 111 which covers the wirings 108 and 109 and part of the insulating layer 107; and the antenna 112 which is connected to the wiring 109 through the insulating layer 111.

The insulating layer 103 serving as a buffer layer is provided to facilitate separation at the interface between the separation layer 101 and the insulating layer 103 serving as a buffer layer in a subsequent separation step or to prevent the semiconductor element and the wiring from being cracked or damaged in a subsequent separation step. The insulating layer 103 serving as a buffer layer is formed using an inorganic compound to be a single layer or a multilayer by a sputtering method, a plasma CVD method, a coating method, a printing method, or the like. As typical examples of the inorganic compound, a silicon oxide, a silicon nitride, a silicon oxynitride, a silicon nitride oxide, and the like can be given. When a silicon nitride, a silicon nitride oxide, a silicon oxynitride, or the like is used for the insulating layer 103 serving as a buffer layer, intrusion of moisture or gas such as oxygen from outside into the element layer to be formed later can be prevented. The thickness of the insulating layer 103 serving as a buffer layer is preferably greater than or equal to 10 nm and less than or equal to 1000 nm, more preferably greater than or equal to 100 nm and less than or equal to 700 nm. Here, a silicon oxynitride layer with a thickness of 500 to 700 nm is formed by a plasma CVD method.

The insulating layer 104 serving as a base layer can be appropriately formed using a formation method and a material which are similar to those of the insulating layer 103 serving as a buffer layer. Further, the insulating layer 104 serving as a base layer may have a stacked-layer structure. For example, the stacked-layer structure may be formed using an inorganic compound. Typically, the insulating layer 104 may be formed by stacking a silicon oxide, a silicon nitride oxide, and a silicon oxynitride. The thickness of the insulating layer 104 serving as a base layer is preferably greater than or equal to 10 nm and less than or equal to 200 nm, more preferably greater than or equal to 50 nm and less than or equal to 150 nm. Here, a silicon nitride oxide layer with a thickness of 30 to 70 nm is formed by a plasma CVD method, and a silicon oxynitride layer with a thickness of 80 to 120 nm is formed thereover by a plasma CVD method. It is to be noted that in the case where the insulating layer 103 serving as a buffer layer is included, the insulating layer 104 serving as a base layer is not necessarily formed.

The insulating layers 106 and 107 serve as an interlayer insulating layer which insulates the thin film transistor and the wiring. The insulating layers 106 and 107 can be formed using a formation method and a material which are similar to those of the insulating layer 103 serving as a buffer layer. Although the insulating layers 106 and 107 are formed in a stacked-layer here, the insulating layers 106 and 107 may be formed in a single layer or a stacked-layer structure including two or more layers. Here, as the insulating layer 106, a silicon oxynitride layer with a thickness of 30 to 70 nm is formed by a plasma CVD method. As the insulating layer 107, a silicon nitride oxide layer with a thickness of 80 to 120 nm is formed by a plasma CVD method, and then, a silicon oxynitride layer with a thickness of 500 to 700 nm is formed by a plasma CVD method.

The wirings 108 and 109 can be formed in a similar manner to the wirings 57a, 57b, 58a, and 58b which are described in Embodiment Mode 1. Here, the wirings 108 and 109 are formed in such a manner that a titanium layer with a thickness of 80 to 120 nm, an aluminum layer with a thickness of 250 to 350 nm, and a titanium layer with a thickness of 80 to 120 nm are stacked in this order, and then, etching is selectively performed using a resist mask formed by a photolithography process.

A protective layer of a silicon nitride, a silicon nitride oxide, diamond-like carbon, carbon nitride, or the like may be provided over the wirings 108 and 109. When the protective layer is provided, moisture intrusion from outside into a thin film transistor can be prevented, so that reliability of electric characteristics of the thin film transistor and the semiconductor device can be improved.

The insulating layer 111 is formed using a formation method and a material which are similar to those of the insulating layer 103 serving as a buffer layer. It is to be noted that the insulating layer 111 is a base layer of an antenna formed later; therefore, a surface of the insulating layer 111 is preferably flat. Accordingly, the insulating layer 111 is preferably formed by applying a composition in which an organic resin is diluted with an organic solvent and performing drying and baking thereon. Further, when the insulating layer 111 is formed using a composition in which a photosensitive resin is diluted, the number of process steps is reduced compared with a process in which etching is performed using a resist mask formed by a conventional photolithography process, leading to a high yield. Here, the insulating layer 111 is formed in such a manner that a composition in which a photosensitive polyimide resin is diluted with an organic solvent is applied and dried, and light exposure using a photomask is performed thereon; and then, an uncured portion is removed and baking is performed.

The antenna 112 is formed using a formation method and a material which are similar to those of the antenna 83 described in Embodiment Mode 1.

Then, over the antenna 112, a structure body 115 in which a fibrous body 113 is impregnated with an organic resin 114 is provided. Such a structure body 115 is also called a prepreg. A prepreg is specifically formed in such a manner that, after a fibrous body is impregnated with a compound in which a matrix resin is diluted with an organic solvent, drying is performed so that the organic solvent is volatilized and the matrix resin is semi-cured. The thickness of the structure body 115 is preferably greater than or equal to 10 µm and less than or equal to 100 µm, more preferably greater than or equal to 10 µm and less than or equal to 30 µm. By using a structure body with such a thickness, a thin semiconductor device capable of being curved can be manufactured.

The structure body 115 is heated and subjected to pressure bonding so that the organic resin 114 of the structure body 115 is plasticized or cured. In the case where the organic resin 114 is an organic plastic resin, the organic resin which is plasticized is then cured by cooling to room temperature.

Figure 3B:
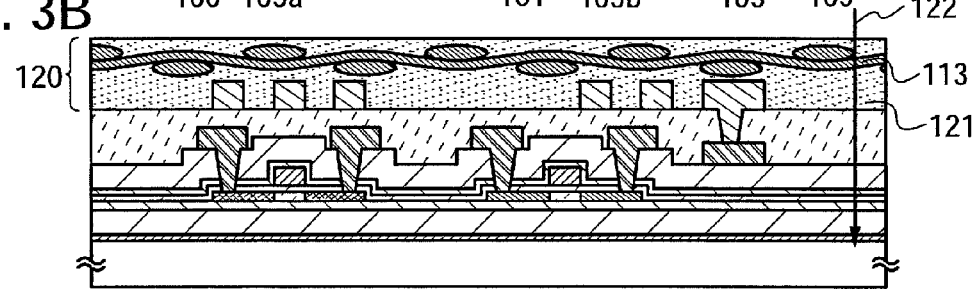

By heating and pressure bonding, the organic resin 114 is uniformly spread over surfaces of the element layer 102 and the antenna 112, and cured. Consequently, as shown in FIG. 3B, the organic resin 114 becomes an organic resin 121 with which the fibrous body 113 is impregnated and which is firmly fixed to one side of the element layer 102 and one side of the antenna 112. It is to be noted that the organic resin 121 and the fibrous body 113 which are firmly fixed to one side of the element layer 102 and one side of the antenna 112 are collectively referred to as a sealing layer 120 in a similar manner to Embodiment Mode 1. A step of pressure bonding of the structure body 115 is performed under an atmospheric pressure or low pressure.

Figure 3C:
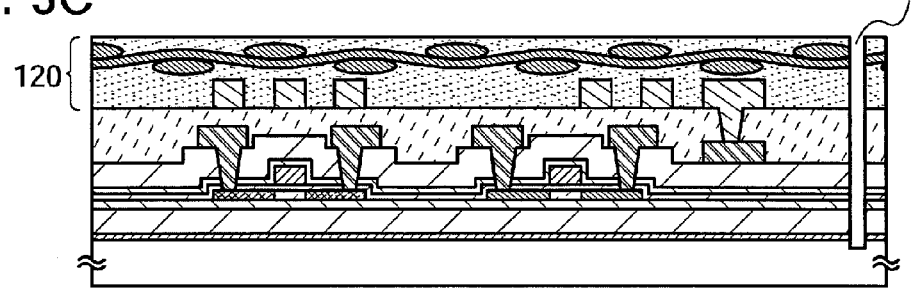

Then, as shown in FIG. 3B, in order to facilitate a subsequent separation step, a groove 123 as shown in FIG. 3C may be formed by irradiating the sealing layer 120, the element layer 102, and the separation layer 101 with a laser beam 122 from the sealing layer 120 side. As the laser beam used for forming the groove 123, a laser beam with a wavelength which is absorbed by any of layers included in the separation layer 101, the element layer 102, or the sealing layer 120 is preferably used. Typically, a laser beam in the ultraviolet region, visible region, or infrared region is appropriately selected for irradiation.

As a laser oscillator which can produce such laser beams, the following can be used: an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaAlAs, or InGaAsP laser. It is to be noted that in the case of using the solid-state laser oscillator, it is preferable to use the fundamental wave to the fifth harmonic as appropriate.

Figure 3D:
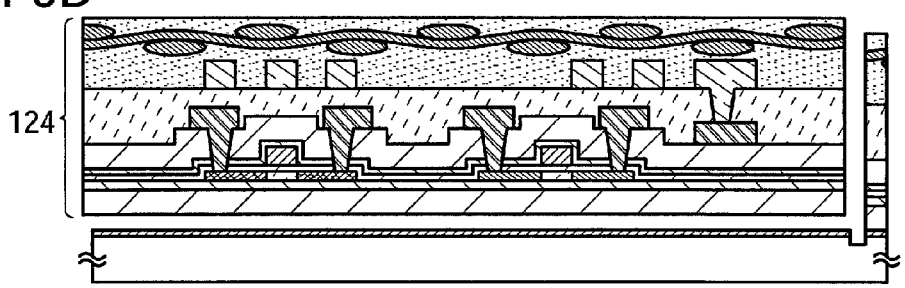

As shown in FIG. 3D, by using the groove 123 as a trigger, the substrate 100 having an insulating surface over which the separation layer 101 is formed and a part 124 of the element layer are separated from each other by a physical means at the interface between the separation layer 101 and the insulating layer 103 serving as a buffer layer. The physical means refers to a dynamic means or a mechanical means; for example, a means for changing some dynamical energy (mechanical energy). Typically, the physical means is an action of applying mechanical force (e.g., a peeling process with a human hand or with a gripper, or a separation process by rotating a roller). At this time, when an adhesive sheet which can be separated by light or heat is provided over a surface of the sealing layer 120, separation can be easily performed.

Further, a liquid may be dropped into the groove 123 and the liquid may be infiltrated into the interface between the separation layer 101 and the insulating layer 103 serving as a buffer layer so that the element layer 102 may be separated from the separation layer 101. In this case, a liquid may be dropped only into the groove 123, or the substrate 100 having an insulating surface, the element layer 102, the antenna 112, and the sealing layer 120 may be wholly soaked in a liquid so that the liquid may be infiltrated from the groove 123 into the interface between the separation layer 101 and the element layer 102.

In this embodiment mode, a method is employed in which a metal oxide layer is formed as a separation layer in contact with a buffer layer, and the part 124 of the element layer is separated by a physical means. However, the present invention is not limited to this, and the following method can be employed: a light-transmitting substrate is used as the substrate 100 having an insulating surface, an amorphous silicon layer containing hydrogen is used as the separation layer, the separation layer 101 is irradiated with a laser beam instead of the laser beam 122 shown in FIG. 3B from the substrate 100 side having an insulating surface, and hydrogen included in the amorphous silicon layer is vaporized so that separation is performed between the substrate 100 having an insulating surface and the separation layer.

In FIG. 3B, instead of a step of irradiation with the laser beam 122, a method of removing the substrate 100 having an insulating surface by mechanical polishing, or a method of removing the substrate 100 having an insulating surface by dissolving the substrate 100 having an insulating surface with a solution such as HF can be employed. In this case, the separation layer can be omitted.

In FIG. 3C, a method can be employed in which a fluoride gas such as $NF_3$, $BrF_3$, or $ClF_3$ is introduced into the groove 123, and the separation layer is removed by etching with the use of the fluoride gas so that the part 124 of the element layer is separated from the substrate 100 having an insulating surface.

Alternatively, in FIG. 3C, a method can be employed in which after a fluoride gas such as $NF_3$, $BrF_3$, or $ClF_3$ is introduced into the groove 123 and part of the separation layer is removed by etching with the use of the fluoride gas, an adhesive member is bonded to the organic resin 121 so that the part 124 of the element layer is separated from the substrate 100 having an insulating surface by a physical means.

In the case where a plurality of semiconductor devices are included in the element layer 102, the plurality of semiconductor devices may be obtained by dividing the element layer 102 and the sealing layers. With such a step, a plurality of semiconductor devices can be manufactured.

Figure 3E:
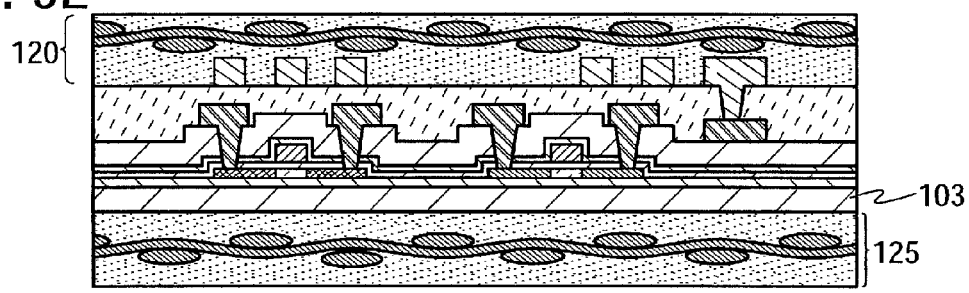

In a manner described above, a semiconductor device can be manufactured. It is to be noted that a sealing layer may also be formed on the insulating layer 103 serving as a buffer layer side. In the case of forming the sealing layer, in a similar manner to FIG. 1A, a structure body is provided on the insulating layer 103 serving as a buffer layer and the structure body is heated and subjected to pressure bonding, so that an organic resin in the structure body is plasticized or cured. In the case where the organic resin is plastic, the plasticized organic resin is then cured by cooling to room temperature. Consequently, as shown in FIG. 3E, a sealing layer 125 including an organic resin 121 with which a fibrous body 113 is impregnated and which is formed on the insulating layer serving as a buffer layer can be formed. That is, a semiconductor device provided with the sealing layers 120 and 125 on opposing surfaces of the element layer 102 can be manufactured.

In the case where a plurality of semiconductor devices are included in the element layer 102, the plurality of semiconductor devices may be obtained by dividing the element layer 102 and the sealing layers. With such a step, a plurality of semiconductor devices can be manufactured. When the division is performed, selective division is possible by dicing, scribing, using a cutting machine having an edged tool such as scissors or a knife, laser cutting, or the like.

In a semiconductor device described in this embodiment mode, an element layer having a semiconductor element formed using a non-single crystal semiconductor layer and a fibrous body are firmly fixed together by an organic resin. In the fibrous body, pressure given by locally pressing is dispersed throughout fiber; thus, local pressure is not easily applied. Accordingly, a wiring or a semiconductor element included in the semiconductor device are not stretched and the semiconductor device is not easily destroyed. Further, because the fibrous body formed from high-strength fiber is firmly fixed to the element layer, the element layer is not easily stretched also in a separation step. That is, stretching of the semiconductor element formed in the element layer, the wiring, or the like can be reduced, and thus, a yield can be improved.

Further, when the element layer is formed to have a small thickness, the semiconductor device can be curved. Accordingly, the area of the element layer can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 3

This embodiment mode describes a manufacturing method of a semiconductor device which is not easily destroyed compared with Embodiment Mode 2, with reference to FIGS. 4A to 4D.

Figure 4A:
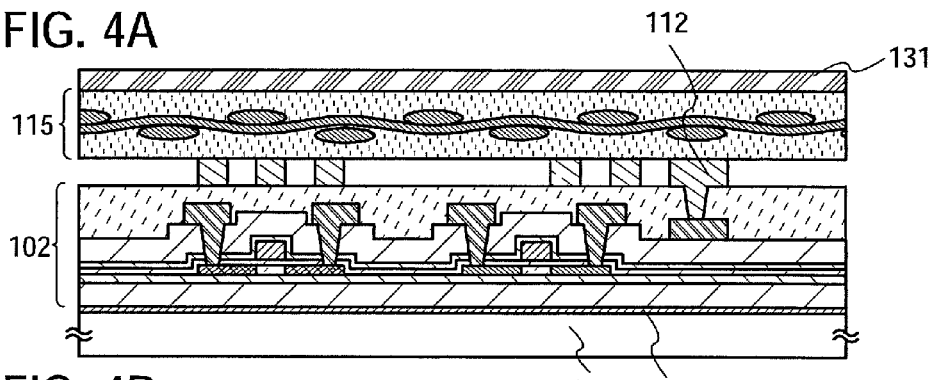
FIGS. 4A to 4D are cross-sectional views illustrating a manufacturing method of a semiconductor device of the present invention.

In a similar manner to Embodiment Mode 1, as shown in FIG. 4A, a separation layer 101 is formed over a substrate 100 having an insulating surface, and an element layer 102 including a semiconductor element formed using a non-single crystal semiconductor layer, and an antenna 112 are formed over the separation layer 101. A structure body 115 is provided over the element layer 102 and the antenna 112, and a protective film 131 is provided over the structure body 115.

The protective film 131 is preferably formed from a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given.

Since the protective film 131 is formed from a high-strength material, destruction by local pressure can be further suppressed compared with Embodiment Mode 2. In specific, in a fibrous body 113 of the structure body 115, in the case where the area of a basket hole in which a warp yarn bundle and a weft yarn bundle are not distributed is larger than the area to which local pressure is applied, when the basket hole is locally loaded, the pressure is not absorbed in the fibrous body 113 of the structure body 115 but is directly applied to the element layer 102 and the antenna 112. As a result, the element layer 102 and the antenna 112 are stretched, and the semiconductor element or the wiring is destroyed.

However, by providing over the structure body 115 the protective film 131 formed from a high-strength material, a local load is absorbed in the entire protective film 131, leading to a semiconductor device which is not easily destroyed by local pressure.

Figure 4B:
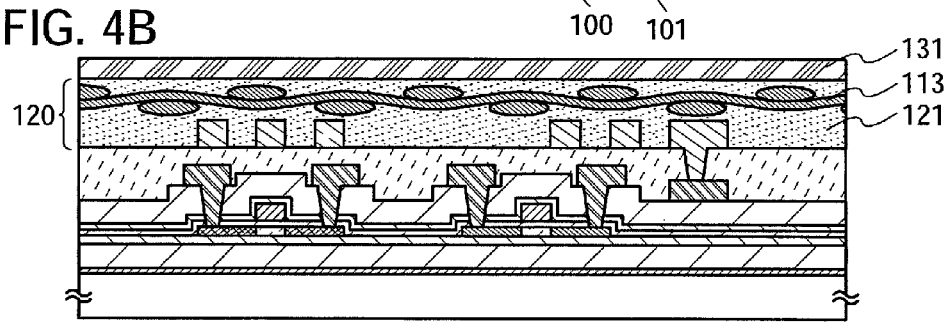

As shown in FIG. 4B, in a similar manner to Embodiment Mode 2, the structure body 115 is heated and subjected to pressure bonding, so that a sealing layer 120 is formed. The protective film 131 is firmly fixed to the element layer 102 and the antenna 112 by an organic resin 121 of the sealing layer. That is, the fibrous body 113 and the protective film 131 are firmly fixed to the element layer 102 and the antenna 112 by the sealing layer 120. The fibrous body 113 is impregnated with the organic resin 121 included in the sealing layer 120.

Figure 4C:
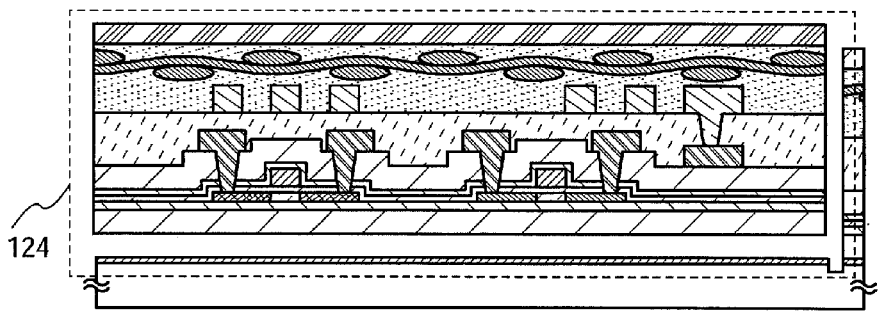

As shown in FIG. 4C, a part 124 of the element layer is separated from the substrate 100 having an insulating surface over which the separation layer 101 is formed. Here, in a similar manner to Embodiment Mode 1, after the element layer 102 and the separation layer 101 are irradiated with a laser beam and the groove is formed, separation is performed by a physical means within a metal oxide layer formed at the interface between the separation layer 101 and the insulating layer 103 serving as a buffer layer.

Figure 4D:
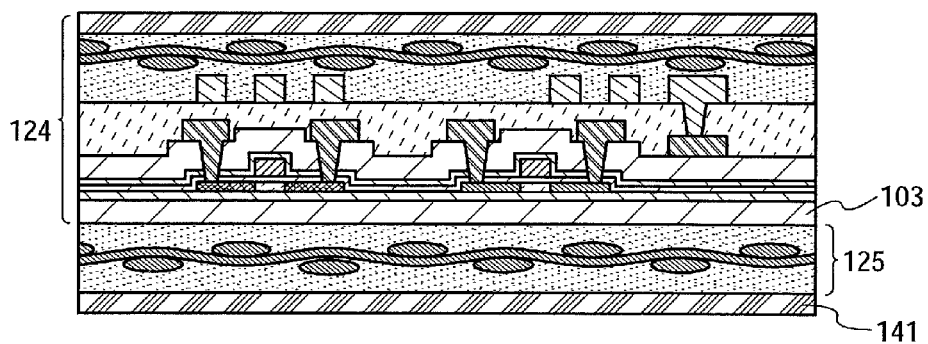

After that, as shown in FIG. 4D, a structure body is provided over a surface of the insulating layer 103 serving as a buffer layer, a protective film is formed over the structure body, and heating and pressure bonding are performed, so that a sealing layer 125 and a protective film 141 are firmly fixed to the insulating layer 103 serving as a buffer layer in the part 124 of the element layer.

In FIG. 4A, in the case where the protective film 131 is a thermoplastic material, the protective film 131 may alternatively be provided between the element layer 102 and the antenna 112, and the structure body 115, and heating and pressure bonding may be performed. In FIG. 4D, in the case where the protective film 141 is a thermoplastic material, the protective film 141 may be provided between the insulating layer serving as a buffer layer and the sealing layer 125, and heating and pressure bonding may be performed. Also in this structure, a load given by locally pressing can be dispersed in the protective film and the structure body, and accordingly, destruction can be reduced.

In the case where a plurality of semiconductor devices are included in the element layer 102, the plurality of semiconductor devices may be obtained by dividing the element layer 102 and the sealing layers. With such a step, a plurality of semiconductor devices can be manufactured.

In a manner described above, a semiconductor device which is not easily destroyed by local pressure can be manufactured. Further, when the element layer is formed to have a small thickness, the semiconductor device can be curved. Accordingly, the area of the element layer can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 4

This embodiment mode describes a method for manufacturing a semiconductor device in which an antenna is not formed in an element layer and an antenna provided over another substrate is connected to an element layer, with reference to FIGS. 5A to 5C and FIGS. 6A to 6C.

Figure 5A:
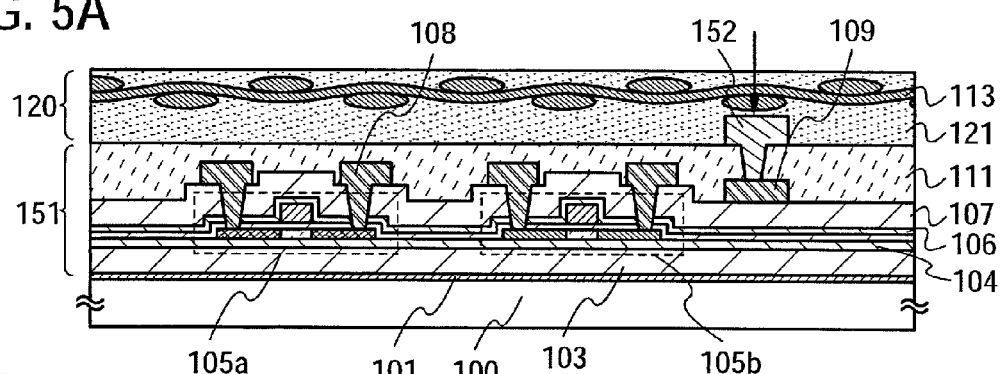
FIGS. 5A to 5C are cross-sectional views illustrating a manufacturing method of a semiconductor device of the present invention.

As shown in FIG. 5A, in a similar manner to Embodiment Mode 1, a separation layer 101 is formed over a substrate 100 having an insulating surface, and an element layer 151 including a semiconductor element formed using a non-single crystal semiconductor layer is formed over the separation layer 101. Then, a structure body in which a fibrous body 113 is impregnated with an organic resin 114 is provided over the element layer 151.

Here, as the element layer 151, as described in Embodiment Mode 1, an insulating layer 103 serving as a buffer layer is formed, an insulating layer 104 serving as a base layer is formed over the insulating layer 103 serving as a buffer layer, and thin film transistors 105a and 105b are formed over the insulating layer 104. Insulating layers 106 and 107 are formed over the thin film transistors 105a and 105b, and wirings 108 and 109 which are connected to a source region and a drain region of a semiconductor layer of the thin film transistor through the insulating layers 106 and 107 are formed. An insulating layer 111 is formed over the wirings 108 and 109 and the insulating layer 107, and an electrode pat 152 which is connected to the wiring 109 through the insulating layer 111 is formed.

Then, in a similar manner to Embodiment Mode 1, the structure body provided over the element layer 151 is heated and subjected to pressure bonding, so that a sealing layer 120 including an organic resin 121 and the fibrous body 113 is formed over one side of the element layer 151.

Then, part of the sealing layer 120 is removed to expose part of the electrode pat 152. Here, an electrode pat 152 is irradiated with a laser beam from the sealing layer 120 side, so that part of the sealing layer 120 is removed. Alternatively, part of the sealing layer 120 may be removed by a general photolithography process so that part of the electrode pat 152 may be exposed.

Figure 5B:
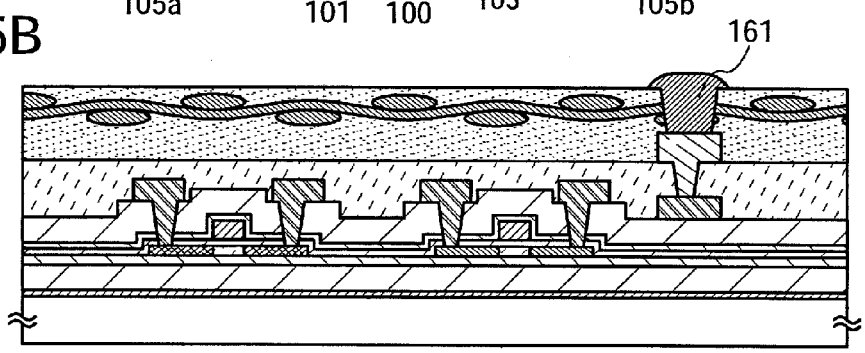
Figure 5C:
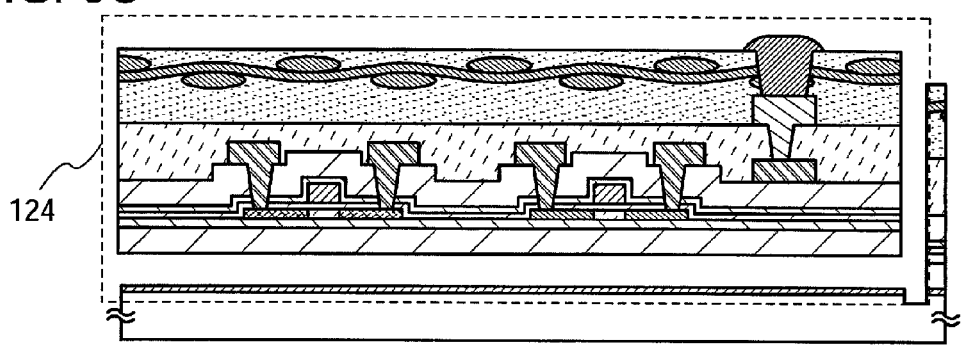

As shown in FIG. 5B, a connection terminal 161 is formed in an opening in the sealing layer 120. The connection terminal 161 can be formed by a printing method, a droplet discharge method, or the like. As a material for the connection terminal 161, at least one of metal particles of silver (Ag), gold (Ag), copper (Cu), nickel (Ni), platinum (Pt), palladium (Pd), tantalum (Ta), molybdenum (Mo), and titanium (Ti); fine particles of silver halide; or dispersive nanoparticles can be used.

The substrate 100 having an insulating substrate, over which the separation layer 101 is formed, and part 124 of the element layer are separated from each other. Here, in a similar manner to Embodiment Mode 1, the element layer and the separation layer 101 are irradiated with a laser beam, so that a groove is formed in the element layer 151. After liquid is supplied to the groove, separation is performed by a physical means at the interface between the separation layer 101 and the insulating layer 103 serving as a buffer layer.

Figure 6A:
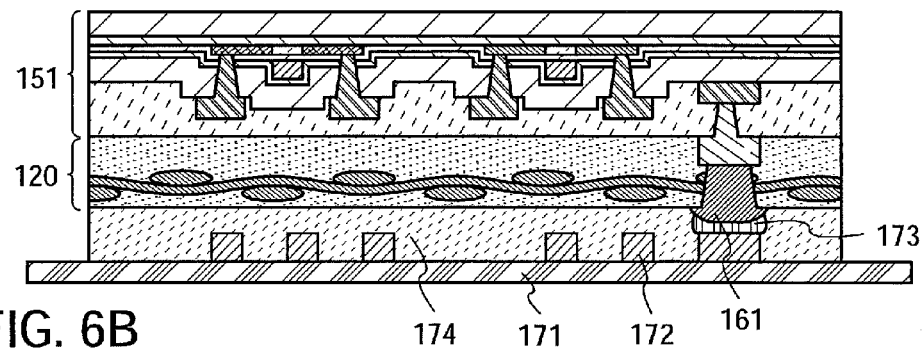
FIGS. 6A to 6C are cross-sectional views illustrating a manufacturing method of a semiconductor device of the present invention.

Then, as shown in FIG. 6A, the sealing layer 120 which is firmly fixed to the element layer 151 and a substrate 171 over which an antenna 172 is formed are bonded together by an adhesive member 174. At this time, the connection terminal 161 which is formed on the element layer 151 and the antenna 172 are electrically connected to each other by an anisotropic conductive adhesive member 173.

As the anisotropic conductive adhesive member 173, an adhesive resin containing conductive particles (each grain size is several nanometers to several tens of micrometers), which are dispersed, such as an epoxy resin or a phenol resin can be given. The conductive particle is formed from one or more elements selected from gold, silver, copper, palladium, nickel, carbon, and platinum. Further, a particle having a multilayer structure of these elements may be used. Furthermore, a conductive particle in which a thin film which is formed from one or more elements selected from gold, silver, copper, palladium, nickel, and platinum is formed over a surface of a particle formed from a resin may be used. Further alternatively, a CNT (carbon nanotube) may be used as the conductive particle.

The antenna 172 can be appropriately formed using a material and a formation method which are similar to those of the antenna 83 described in Embodiment Mode 1.

As the substrate 171 over which the antenna 172 is formed, a plastic film substrate, for example, a plastic substrate of polyethylene terephthalate (PET), polyether sulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like can be used.

Figure 6B:
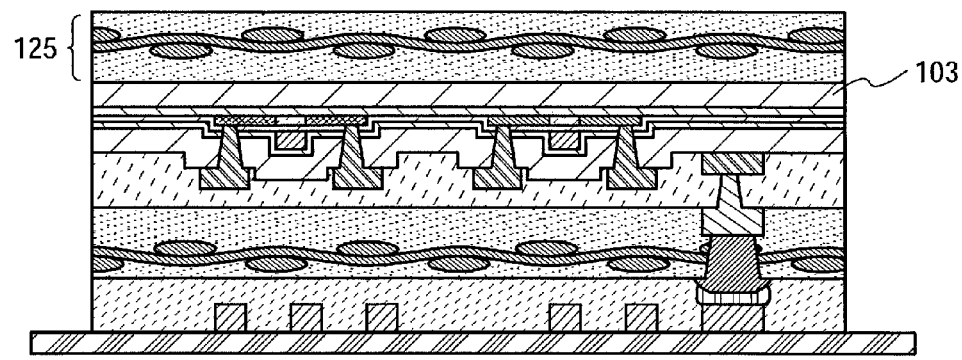

Then, as shown in FIG. 6B, in a similar manner to Embodiment Mode 1, a structure body is provided over a surface of the insulating layer 103 serving as a buffer layer, and heating and pressure bonding are performed, so that a sealing layer 125 is formed over the insulating layer 103 serving as a buffer layer.

Figure 6C:
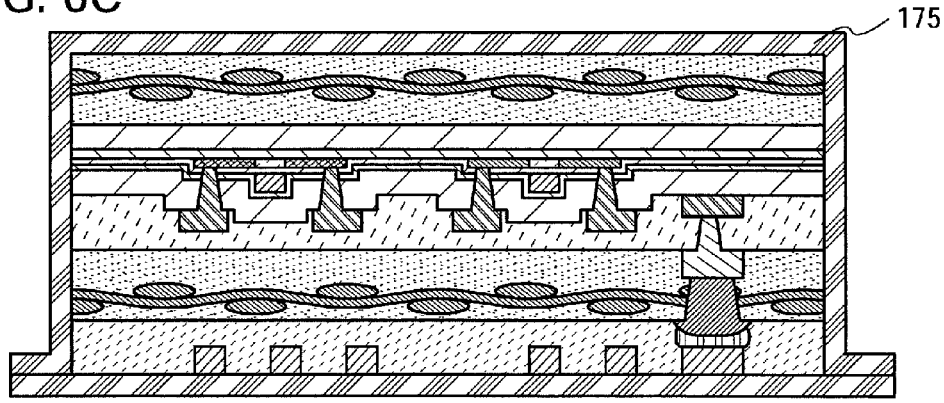

Then, as shown in FIG. 6C, a film 175 may be provided so as to seal the substrate 171 over which the antenna 172 is formed, the sealing layer 120, the element layer 151, and the sealing layer 125. The film can be a film similar to that of the substrate 171 over which the antenna 172 is formed.

This embodiment mode describes a mode in which, after the element layer 151 is separated from the separation layer 101, the substrate 171 over which the antenna 172 is formed is bonded to the sealing layer 120 on the element layer 151. Alternatively, as shown in FIG. 5B, after the connection terminal 161 is formed, the sealing layer 120 and the substrate 171 over which the antenna 172 is formed are bonded together, and the antenna 172 and the connection terminal 161 are electrically connected to each other by an anisotropic conductive adhesive member; then, the element layer 151 may be separated from the separation layer 101. Further, as shown in FIG. 6B, the sealing layer 125 may be formed over the insulating layer serving as a buffer layer, and as shown in FIG. 6C, the substrate 171 over which the antenna 172 is formed, the sealing layer 120, the element layer 151, and the sealing layer 125 may be sealed with the film 175.

Figure 7A:
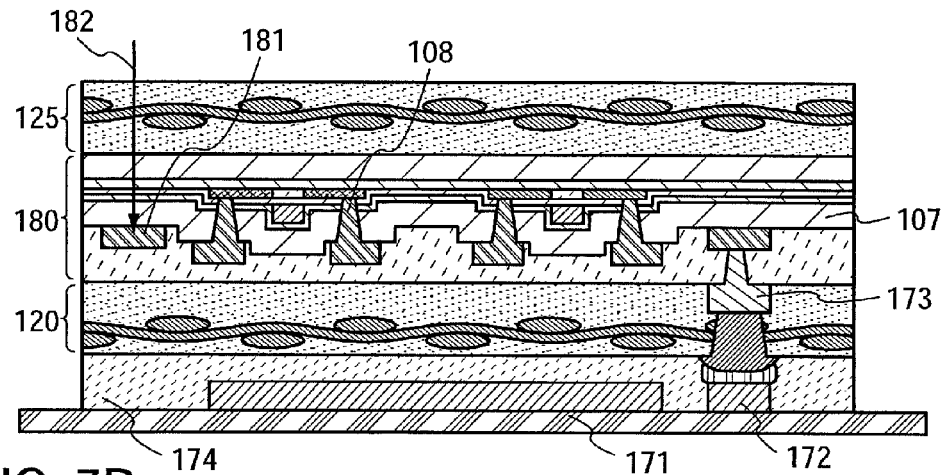
FIGS. 7A to 7C are cross-sectional views illustrating a manufacturing method of a semiconductor device of the present invention.

The above mode describes a semiconductor device in which the substrate 171 having the antenna 172 is bonded to only one surface of the element layer 151; however, the substrates over each of which the antenna is formed may be bonded to both surfaces of the element layer 151. The mode is described with reference to FIGS. 7A to 7C.

Through the steps shown in FIGS. 5A to 5C and FIG. 6A, the substrate 171 over which the antenna 172 is formed and the sealing layer 120 provided on one surface of the element layer 180 are bonded together by the adhesive member 174. The opposite surface of the element layer 180 is provided with the sealing layer 125. In the element layer 180, a wiring 181 which is formed in a similar manner to the wiring 108 connected to source regions and drain regions of semiconductor layers of the thin film transistors 105a and 105b is formed over the insulating layer 107. As the wiring 181, a wiring may be formed at the same time as gate electrodes 55a and 55b over the insulating layer 106.

In order to form a connection terminal which is connected to the wiring 181, an opening is formed in part of the sealing layer 125 and the element layer 180. Here, the opening is formed by irradiating the wiring 181 with a laser beam 182 from the sealing layer 125 side, and part of the wiring 181 is exposed.

Figure 7B:
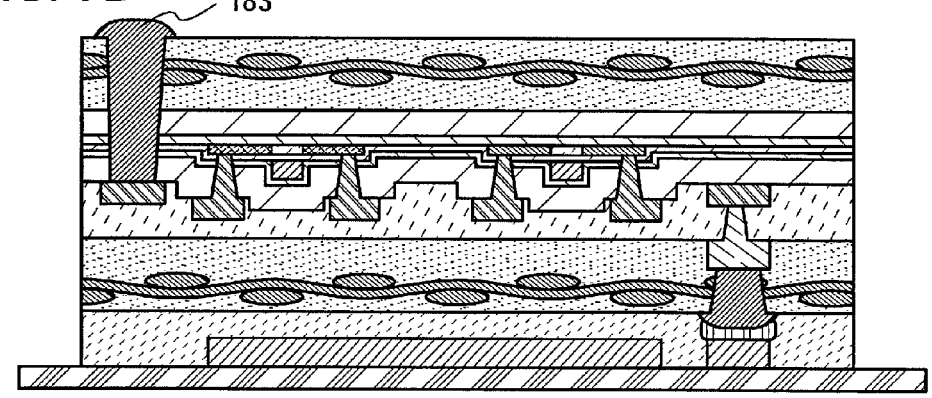

Then, as shown in FIG. 7B, a connection terminal 183 is formed so as to fill the opening. The connection terminal 183 can be formed in a similar manner to the connection terminal 161.

Figure 7C:
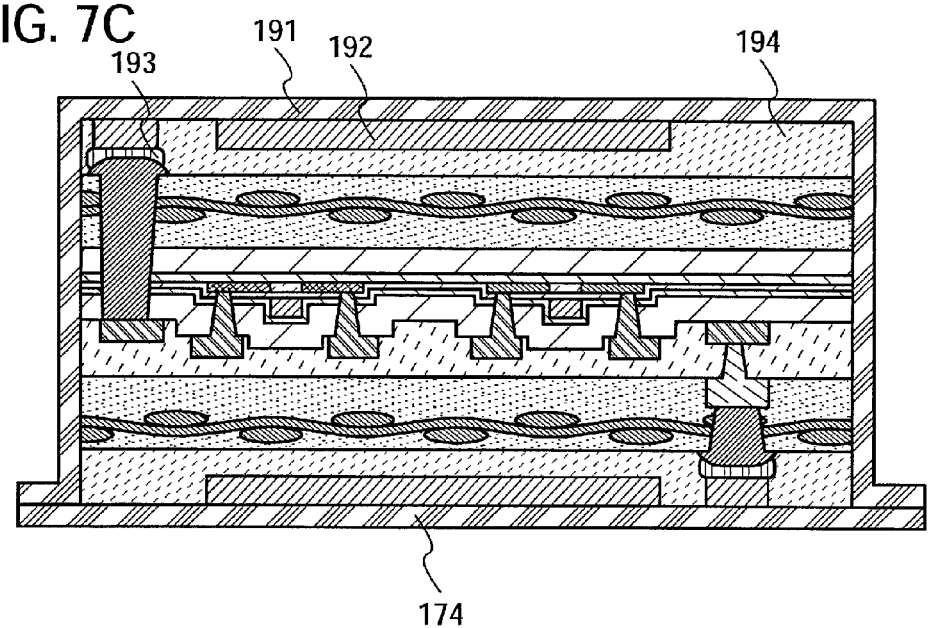

As shown in FIG. 7C, the sealing layer 125 and a substrate 191 provided with an antenna 192 are bonded together, and the connection terminal 183 and the antenna 192 are electrically connected to each other by an anisotropic conductive adhesive member 193.

In a manner described above, a semiconductor device in which both surfaces of the element layer are provided with antennas can be manufactured. Such a structure is preferably applied to the semiconductor device having a symmetrical antenna such as an RFID capable of receiving an electric wave of a UHF band, because the size of the semiconductor device can be reduced.

In the case where a plurality of semiconductor devices are included in each of the element layers 151 and 180, the plurality of semiconductor devices may be obtained by dividing the element layers 151 and 180 and the sealing layers. With such a step, a plurality of semiconductor devices can be manufactured.

In a semiconductor device described in this embodiment mode, an element layer having a semiconductor element formed using a non-single crystal semiconductor layer and a fibrous body are firmly fixed together by an organic resin. In the fibrous body, pressure given by locally pressing is dispersed throughout fiber; thus, local pressure is not easily applied. Accordingly, a wiring or a semiconductor element included in the semiconductor device are not stretched and the semiconductor device is not easily destroyed. Further, because the fibrous body formed from high-strength fiber is firmly fixed to the element layer, the element layer is not easily stretched also in a separation step. That is, stretching of the semiconductor element formed in the element layer, the wiring, or the like can be reduced, and thus, a yield can be improved.

Further, when the element layer is formed to have a small thickness, the semiconductor device can be curved. Accordingly, the area of the element layer can be enlarged, and thus, steps of manufacturing the semiconductor device can be easily performed because a connection area for connecting an external antenna to the element layer can be enlarged. In the case where the semiconductor device is an RFID with a built-in antenna, the size of the antenna can be increased. Thus, an RFID with a long communication distance can be manufactured.

Embodiment Mode 5

Figure 10A:
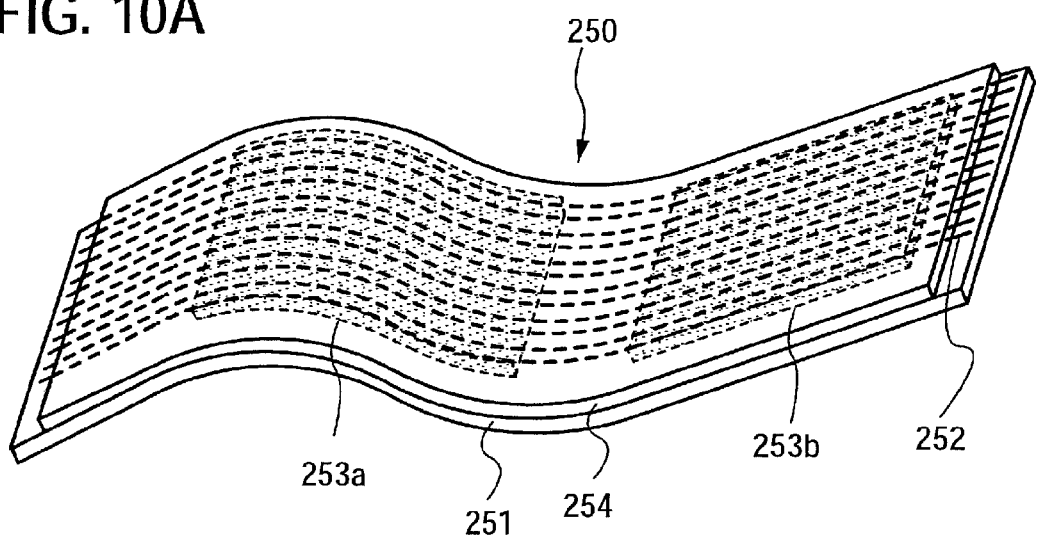
FIGS. 10A and 10B are a perspective view and a cross-sectional view, respectively, each of which illustrates a semiconductor device of the present invention.
Figure 10B:
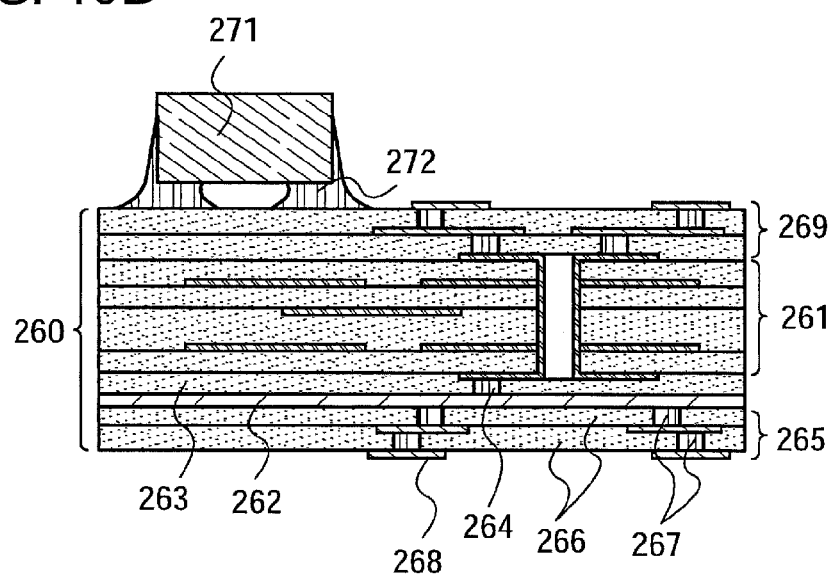

This embodiment mode describes a semiconductor device in which any of the element layers, which are described in Embodiment Modes 1 to 4, including a semiconductor element formed using a non-single crystal semiconductor layer is connected to a printed board, with reference to FIGS. 10A and 10B.

FIG. 10A is a perspective view of a semiconductor device 250 of this embodiment mode. In the semiconductor device 250, an element layer including a semiconductor element formed using a non-single crystal semiconductor layer, which is described in Embodiment Modes 1 to 4, is provided for a flexible printed board. For example, a wiring 252 formed from copper, gold, silver, aluminum, or the like is provided over a base film 251 formed from polyester, polyimide, or the like. Stacks 253a and 253b, in each of which the element layer including a semiconductor element formed using a non-single crystal semiconductor layer, which is described in Embodiment Modes 1 to 4, and a sealing layer are stacked are provided over the wiring 252 with an insulating layer interposed between the wiring 252 and the stacks 253a and 253b. The wiring 252 is connected to the stacks 253a and 253b through a connection terminal formed in a contact hole of the sealing layer. Part of the base film 251, part of the wiring 252, and the stacks 253a and 253b are covered with a protective film 254. In an edge portion of the semiconductor device 250, part of the protective film 254 is removed and an external circuit such as a connector and the wiring 252 are exposed.

The element layer is provided for the wiring with the sealing layer interposed therebetween, and the element layer can be firmly fixed to the wiring and a base substrate by heating and pressure bonding.

Here, a semiconductor device having the wiring 252 of one layer is described below. Alternatively, a multilayer wiring structure may be employed. Further, a plurality of wirings may interpose the stacks 253a and 253b. Such a multilayer wiring can increase packing density.

FIG. 10B is a cross-sectional view of a semiconductor device 260 of this embodiment mode. In the semiconductor device 260, an element layer including a semiconductor element formed using a non-single crystal semiconductor layer, which is described in Embodiment Modes 1 to 4, is provided on a printed board. For example, an element layer 262 including a semiconductor element formed using a non-single crystal semiconductor layer, which is described in Embodiment Modes 1 to 4, is provided on one surface of a core layer 261. A wiring or a semiconductor element included in the element layer 262 including a semiconductor element formed using a non-single crystal semiconductor layer, which is described in Embodiment Modes 1 to 4, is connected to the core layer 261 by a via 264 passing through a sealing layer 263.

A build-up layer 265 is provided on the element layer 262. The core layer 261, and the semiconductor element, the wiring, and the like which are formed in the element layer 262 are connected to a conductive pattern 268 formed on a surface of the semiconductor device 260, by vias 267 formed in organic resin layers 266 of the build-up layer 265.

A build-up layer 269 is provided on the opposite surface of the core layer 261.

In addition, a chip 271 such as a capacitor, a coil, a resistor, or a diode may be mounted on the semiconductor device 260 with the use of a mounting member 272 such as a conductive paste or a wire.

In the semiconductor device of this embodiment mode, a printed board has a layer including a semiconductor element formed using a non-single crystal semiconductor layer. Further, the element layer is provided in a printed board with the use of a prepreg using a fibrous body. Thus, even when a local load (point pressure, linear pressure, or the like) is applied, pressure is dispersed in the fibrous body, and destruction in a mounting step or generated by a curve can be reduced. Furthermore, high integration is possible.

Embodiment Mode 6

This embodiment mode describes an example of manufacturing a substrate having a conductive layer which can reduce destruction caused by a local load (point pressure, linear pressure, and the like).

Here, a manufacturing method is described below in which a substrate having an antenna is used as an example for a substrate having a conductive layer.

Figure 11A:
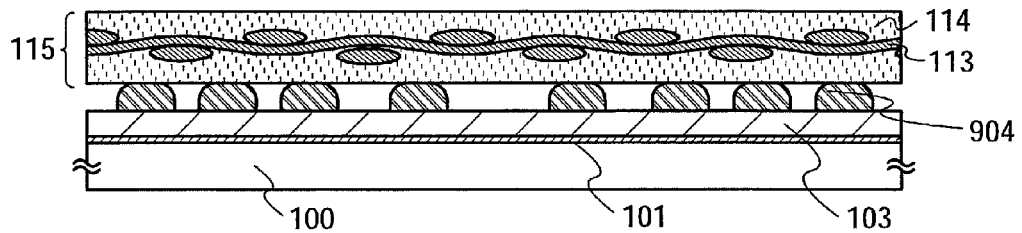
FIGS. 11A to 11E are cross-sectional views and a perspective view which illustrate a manufacturing method of a semiconductor device of the present invention.

First, in a similar manner to Embodiment Mode 1, as shown in FIG. 11A, a separation layer 101 is formed over a substrate 100 having an insulating surface, an insulating layer 103 serving as a buffer layer is formed over the separation layer 101, and a conductive layer 904 serving as an antenna is formed over the insulating layer 103.

The conductive layer 904 serving as an antenna can be appropriately formed using a formation method and a material which are similar to those of the antenna 83 described in Embodiment Mode 1.

Then, in a similar manner to Embodiment Modes 2 to 4, a structure body 115 in which a fibrous body 113 is impregnated with an organic resin 114 is provided over the conductive layer 904.

Figure 11B:
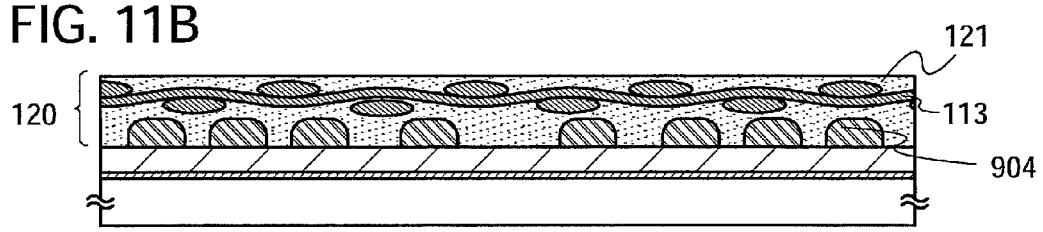

Then, the structure body 115 is heated and subjected to pressure bonding, and as shown in FIG. 11B, a sealing layer including an organic resin 121 with which the fibrous body 113 is impregnated is formed on one side of the conductive layer 904 and one side of the insulating layer 103. It is to be noted that the organic resin 121 and the fibrous body 113 which are firmly fixed to one side of the conductive layer 904 and one side of the insulating layer 103 are collectively referred to as a sealing layer 120 in a similar manner to Embodiment Mode 1. A step of pressure bonding of the structure body 115 is performed under an atmospheric pressure or low pressure. Here, the insulating layer 103 and the sealing layer 120 are collectively referred to as a stack 126.

Figure 11C:
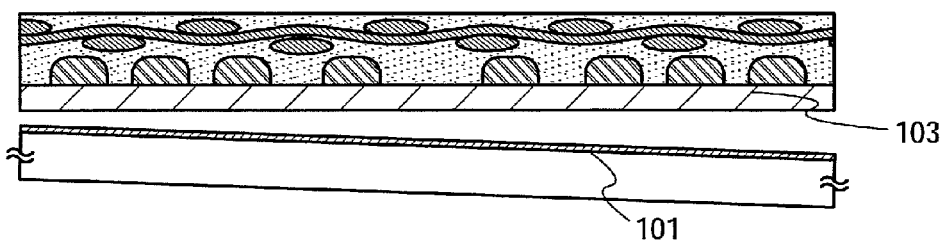

As shown in FIG. 11C, separation similar to that of Embodiment Modes 2 to 4 is performed, so that the insulating layer 103 is separated from the substrate 100 having an insulating surface.

Figure 11D:
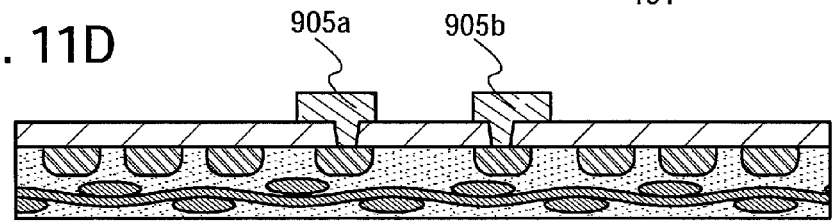

Then, part of the insulating layer 103 or the sealing layer 120 is removed to expose part of the conductive layer 904. Then, as shown in FIG. 11D, connection terminals 905a and 905b which are connected to the conductive layer 904 are formed. The connection terminals 905a and 905b can be formed in a similar manner to the connection terminal 161 described in Embodiment Mode 4. Instead of partial removal of the insulating layer 103, the sealing layer 120 may be partially removed and the connection terminals 905a and 905b may be formed.

Through the above steps, a substrate having a conductive layer serving as an antenna can be manufactured. Further, an RFID can be manufactured by connecting an element substrate to the antenna. The method is described below.

Figure 11E:
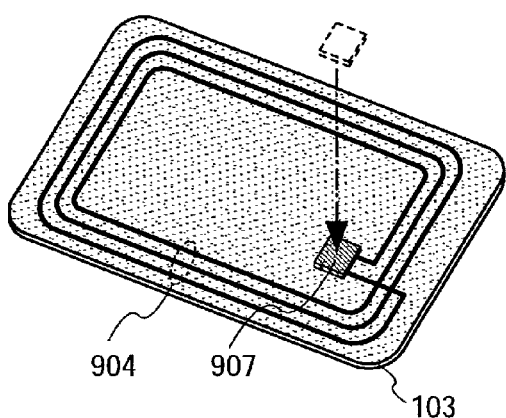

As shown in FIG. 11E, an element substrate 907 is disposed over the insulating layer 103. Electrical connection between a terminal portion of the element substrate and the conductive layer 904 is made by pressure bonding with the use of an anisotropic conductive material.

Moreover, when a plurality of conductive layers each serving as an antenna is formed in a stack 126, the stack may be divided up and a plurality of stacks each having a conductive layer 904 serving as an antenna may be formed, and then, the element substrate may be connected to the conductive layer 904.

FIG. 11E shows an example in which the element substrate 907 with a smaller area than the insulating layer 103 is provided. However, there is no particular limitation thereon, and an element substrate with almost the same area as the insulating layer 103 may be provided, or an element substrate with a larger area than the insulating layer 103 may be provided.

Through the above steps, a semiconductor device serving as an IC tag is completed. Further, a semiconductor device which is not easily destroyed by local pressure can be manufactured.

It is to be noted that, finally, for the purpose of protection, the structure body in which the fibrous body is impregnated with the organic resin may be firmly fixed to the insulating layer 103 so as to cover the element substrate 907.

Embodiment Mode 7

This embodiment mode describes a structure and an application example of a semiconductor device of the present invention. Here, an RFID and a memory device are described as typical examples of a semiconductor device.

Figure 12:
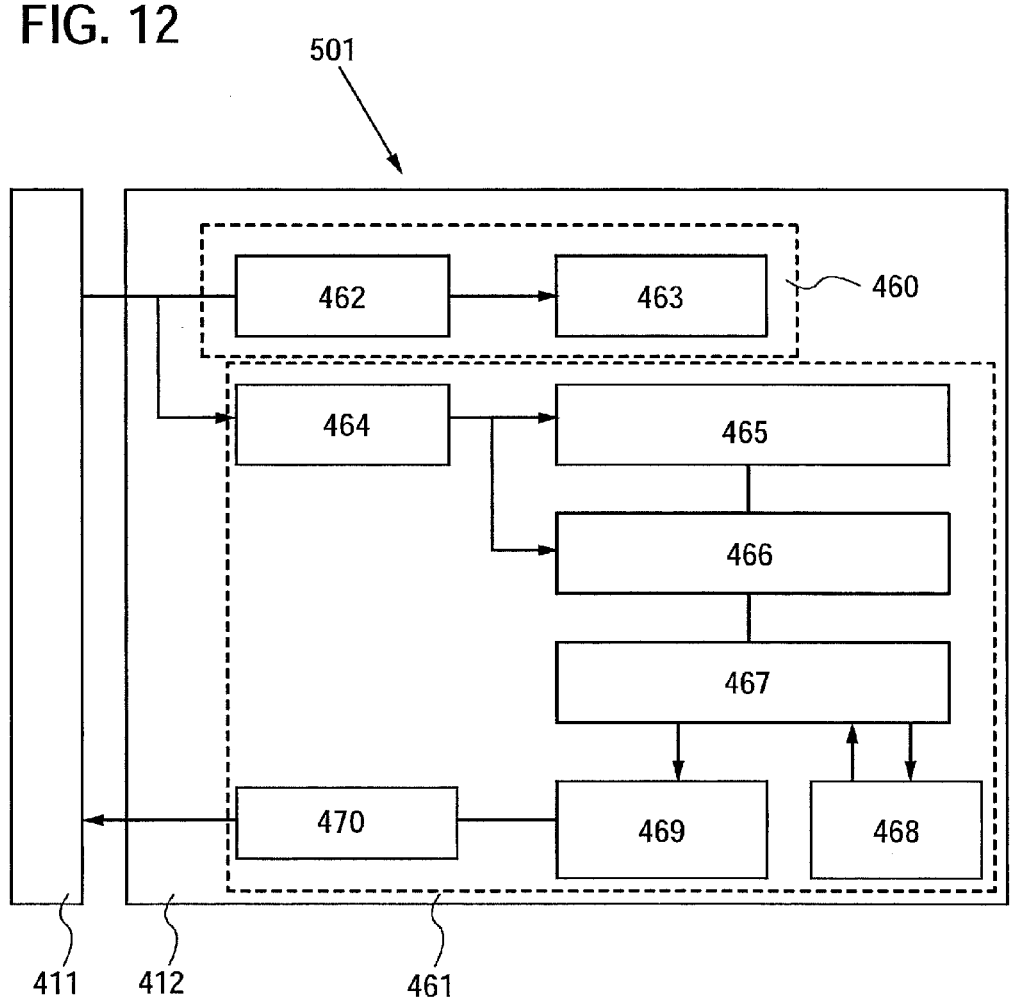
FIG. 12 is a diagram illustrating a semiconductor device of the present invention.

First, a circuit structure example of an RFID 501, which is one of the semiconductor devices of the present invention, is described. FIG. 12 shows a block circuit diagram of the RFID 501.

The RFID 501 in FIG. 12 conforms to specifications of ISO 15693 of the International Organization for Standardization, and it is a vicinity type, and has a communication signal frequency of 13.56 MHz. Also, reception only responds to a data reading instruction, data transmission rate in transmission is about 13 kHz, and the Manchester code is used for a data encoding format.

A circuit portion 412 of the RFID 501 is roughly separated into a power supply portion 460 and a signal processing portion 461. The power supply portion 460 includes a rectifying circuit 462 and a storage capacitor 463. Further, the power supply portion 460 may be provided with a protection circuit portion (also called a limiter circuit) to protect the internal circuit when the amount of electric power received by an antenna 411 is too large, and a protection circuit control circuit portion to control whether or not to operate the protection circuit portion. By providing the circuit portion, a malfunction can be prevented, which is caused by receiving the large amount of electric power by the RFID under the situation or the like in which a communication distance between the RFID and a communication instrument is extremely short. Thus, reliability of the RFID can be improved. That is, the RFID can be normally operated without degradation of an element in the RFID or destruction of the RFID itself.

Here, a communication instrument may have a means for transmitting and receiving information to/from the RFID by wireless communication, and for example, a reader which reads information, a reader/writer having a function of reading and a function of writing, and the like can be given. Further, a mobile phone, a computer, or the like having one of or both the function of reading and the function of writing is also included.

The rectification circuit 462 rectifies a carrier wave received by the antenna 411 and generates direct-current voltage. The storage capacitor 463 smoothes the direct-current voltage generated in the rectification circuit 462. The direct-current voltage generated in the power supply portion 460 is supplied to each circuit of the signal processing portion 461 as power supply voltage.

The signal processing portion 461 includes a demodulation circuit 464, a clock generation/correction circuit 465, a recognition/determination circuit 466, a memory controller 467, a mask ROM 468, an encoding circuit 469, and a modulation circuit 470.

The demodulation circuit 464 is a circuit that demodulates a signal received by the antenna 411. The received signal that is demodulated in the demodulation circuit 464 is input to the clock generation/correction circuit 465 and the recognition/determination circuit 466.

The clock generation/correction circuit 465 generates a clock signal that is necessary for operating the signal processing portion 461, and also has a function of correcting the clock signal. For example, the clock generation/correction circuit 465 includes a voltage controlled oscillator circuit (hereinafter referred to as "VCO circuit"), and turns an output from the VCO circuit into a feedback signal, makes a phase comparison with a supplied signal, and adjusts an output signal by negative feedback so that the feedback signal and a signal that is input are each in a certain phase.

The recognition/determination circuit 466 recognizes and determines an instruction code. The instruction code that is recognized and determined by the recognition/determination circuit 466 is an end-of-frame (EOF) signal, a start-of-frame (SOF) signal, a flag, a command code, a mask length, a mask value, or the like. Also, the recognition/determination circuit 466 has a cyclic redundancy check (CRC) function that identifies a transmission error.

The memory controller 467 reads data from a mask ROM based on a signal processed by the recognition/determination circuit 466. Also, an ID or the like is stored in the mask ROM 468. By mounting the mask ROM 468, the RFID 501 is formed to be dedicated to reading, so that replication or falsification is impossible. Paper which is prevented from forgery can be provided by embedding the RFID 501 dedicated to reading in paper.

The encoding circuit 469 encodes data that is read from the mask ROM 468 by the memory controller 467. The encoded data is modulated in the modulation circuit 470. The data modulated in the modulation circuit 470 is transmitted from the antenna 411 as a carrier wave.

Next, usage examples of an RFID are described. An RFID of the present invention can be used for various paper media and film media. In particular, the RFID of the present invention can be used for various paper media for which forgery prevention is necessary. The paper media are, for example, banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, deeds of mortgage, and the like.

Also, by implementing the present invention, a lot of information, more information than that which is visually shown on a paper medium, can be held in the paper medium or the film medium. Accordingly, by applying the RFID of the present invention to a product label or the like, electronic systemization of merchandise management or prevention of product theft can be realized. Usage examples of paper according to the present invention are described below with reference to FIGS. 13A to 13E.

Figure 13A:
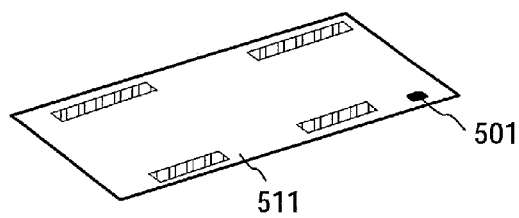
FIGS. 13A to 13E are perspective views each illustrating an application example of a semiconductor device of the present invention.
Figure 13B:
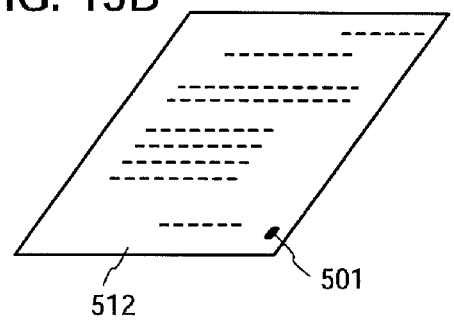

FIG. 13A is an example of a bearer bond 511 using paper embedded with an RFID 501 of the present invention. The bearer bond 511 includes a stamp, a ticket, an admission ticket, a gift certificate, a book coupon, a stationery coupon, a beer coupon, a rice coupon, various gift coupons, various service coupons, and the like, but of course the bearer bond 511 is not limited thereto. Also, FIG. 13B is an example of a certificate 512 using paper embedded with the RFID 501 of the present invention (for example, a residence certificate or a family register).

Figure 13C:
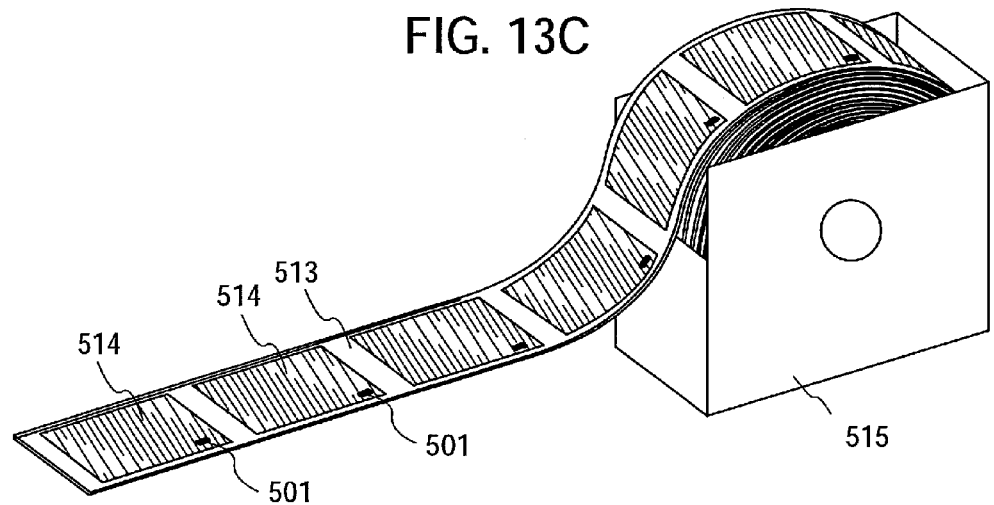

FIG. 13C is an example of applying the RFID of the present invention as a label. A label (ID sticker) 514 is formed of the paper embedded with the RFID 501, over a label base (separate paper) 513. The label 514 is stored in a box 515. On the label 514, information regarding a product or a service (such as product name, brand, trademark, trademark owner, seller, or manufacturer) is printed. Also, since a unique ID number of the product (or a category of the product) is stored in the RFID 501, forgery, infringement of intellectual property rights such as a trademark right or a patent right, and illegal activity such as unfair competition can be spotted easily. The RFID 501 can be input with a large amount of information that cannot all be written on a container or a label of the product, such as the product's area of production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication instrument. Further, the information can easily be rewritten, erased, or the like on a producer side, but cannot be rewritten, erased or the like on a transactor or consumer side.

Figure 13D:
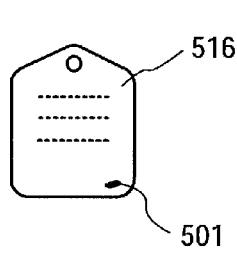
Figure 13E:
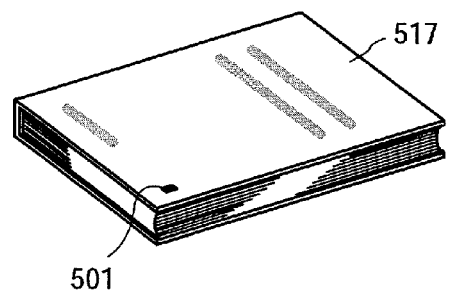

FIG. 13D shows a tag 516 formed of paper or a film which is embedded with the RFID 501. By manufacturing a tag 516 with the paper or film which is embedded with the RFID 501, the tag can be manufactured less expensively than a conventional ID tag using a plastic chassis. FIG. 13E shows a book 517 using the paper of the present invention for a cover, and the RFID 501 is embedded in the cover.

By attaching the label 514 or the tag 516 on which an RFID as an example of a semiconductor device of the present invention is mounted, to the product, merchandise management becomes easy. For example, when the product is stolen, the perpetrator can be spotted quickly by following a route of the product. In this manner, by using the RFID of the present invention for an ID tag, historical management of the product's raw material, area of production, manufacturing and processing, distribution, sales, and the like, as well as tracking inquiry becomes possible. That is, the product becomes traceable. Also, by the present invention, a tracing management system of the product can be introduced at lower cost than before.

An RFID which is an example of a semiconductor device of the present invention is not easily destroyed by local pressure. Accordingly, a paper medium and a film medium each having an RFID which is an example of a semiconductor device of the present invention can be curved in a process such as attachment or setting, leading to improvement of treatment efficiency. Further, since information can be written with a writing material to a paper medium or a film medium each having an RFID which is an example of a semiconductor device of the present invention, the range of uses is increased.

Next, a structure of a memory device which is one mode of a semiconductor device of the present invention is described below. Here, description is made by using a nonvolatile memory device as a typical example of a memory device.

FIG. 14 shows an example of a circuit block diagram of a nonvolatile semiconductor memory device. The nonvolatile semiconductor memory device includes a memory cell array 552 and a peripheral circuit 554 which are formed over the same element layer. The memory cell array 552 has a nonvolatile memory element as described in Embodiment Mode 1. A structure of the peripheral circuit 554 is as described below.

A row decoder 562 for selecting a word line and a column decoder 564 for selecting a bit line are provided around the memory cell array 552. An address is sent to a control circuit 558 through an address buffer 556, and an inner row address signal and an inner column address signal are transferred to the row decoder 562 and the column decoder 564, respectively.

Potential obtained by boosting power supply potential is used for writing and erasing of data. Therefore, a booster circuit 560 controlled by the control circuit 558 according to an operation mode is provided. Output of the booster circuit 560 is supplied to a word line or a bit line through the row decoder 562 and the column decoder 564. Data output from the column decoder 564 is input to a sense amplifier 566. Data read by the sense amplifier 566 is retained in a data buffer 568. Data retained in the data buffer 568 is accessed randomly by control by the control circuit 558, and is output through a data input/output buffer 570. Writing data is once retained in the data buffer 568 through the data input/output buffer 570 and is transferred to the column decoder 564 by control by the control circuit 558.

As described above, in the nonvolatile semiconductor memory device, potential that differs from the power supply potential is necessary to be used in the memory cell array 552. Therefore, it is desirable that at least the memory cell array 552 and the peripheral circuit 554 be electrically insulated and isolated. In this case, when a nonvolatile memory element and a transistor of a peripheral circuit are formed using a non-single crystal semiconductor layer formed over an insulating surface, insulation and isolation can be easily performed. Accordingly, a nonvolatile semiconductor memory device with no malfunction and low power consumption can be obtained.

Embodiment Mode 8

This embodiment mode describes an electronic device using a semiconductor device of the present invention.

As electronic devices to which a semiconductor device of the present invention is applied, cameras such as video cameras or digital cameras, goggle displays (head mounted displays), navigation systems, audio reproducing devices (e.g., car audio or audio component sets), computers, game machines, portable information terminals (e.g., mobile computers, mobile phones, portable game machines, or electronic books), and image reproducing devices provided with storage media (specifically, a device for reproducing the content of a storage medium such as a DVD (Digital Versatile Disc) and having a display for displaying the reproduced image) can be given. FIGS. 15A to 15E show specific examples of such electronic devices.

Figure 15A:
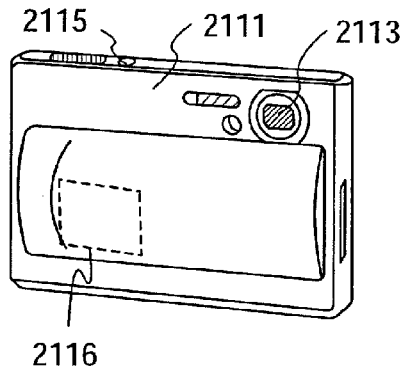
FIGS. 15A to 15E are views each illustrating an electronic device to which a semiconductor device of the present invention can be applied.
Figure 15B:
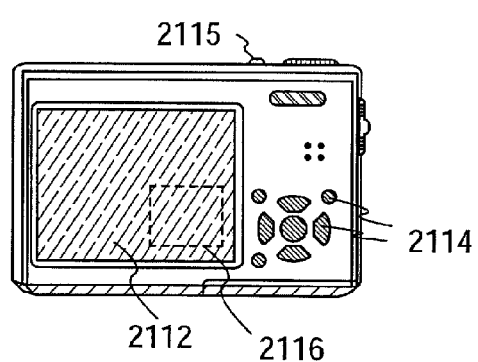

FIGS. 15A and 15B show digital cameras. FIG. 15B shows a rear side of FIG. 15A. This digital camera includes a housing 2111, a display portion 2112, a lens 2113, operating keys 2114, a shutter 2115, and the like. A semiconductor device 2116 of the present invention which has a function as a storage device, an MPU, an image sensor, or the like is provided inside the housing 2111.

Figure 15C:
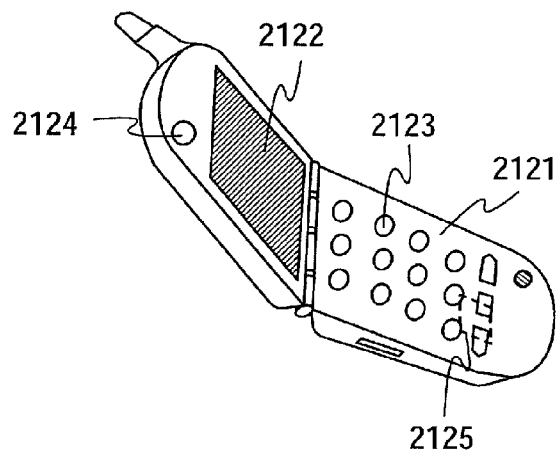

FIG. 15C shows a mobile phone which is one typical example of a portable terminal. This mobile phone includes a housing 2121, a display portion 2122, operating keys 2123, and the like. A semiconductor device 2125 of the present invention which has a function as a storage device, an MPU, an image sensor, or the like is provided inside the mobile phone.

Figure 15D:
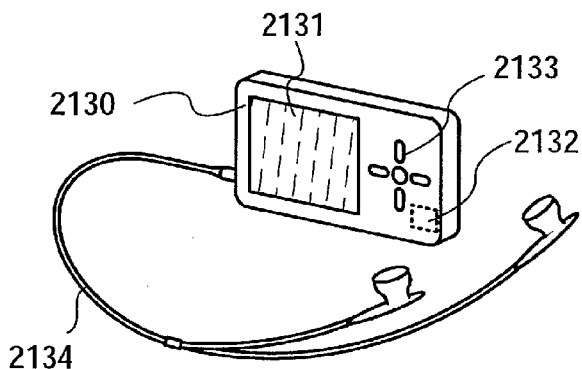

FIG. 15D shows a digital player which is one typical example of an audio device. The digital player shown in FIG. 15D includes a main body 2130, a display portion 2131, a semiconductor device 2132 of the present invention which has a function as a storage device, an MPU, an image sensor, or the like, an operating portion 2133, a pair of earphones 2134, and the like.

Figure 15E:
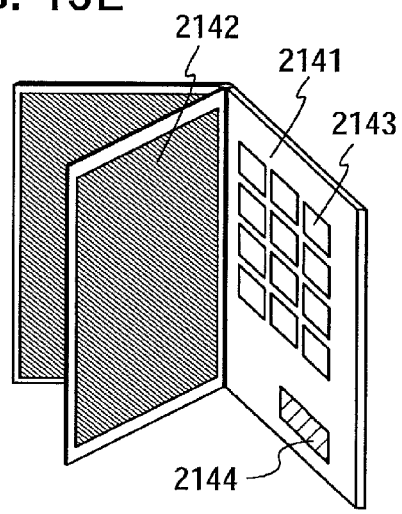

FIG. 15E shows an e-book device (also called an e-book reader). This e-book device includes a main body 2141, a display portion 2142, operating keys 2143, and a semiconductor device 2144 of the present invention which has a function as a storage device, an MPU, an image sensor, or the like. In addition, a modem may be built into the main body 2141, or a structure capable of wireless data transmission and reception may be employed.

In a manner described above, the applicable range of the semiconductor device of the present invention is so wide that the semiconductor device can be applied to other electronic devices.

Embodiment 1

This embodiment describes below an inlay provided with a prepreg in an element layer, a method for embedding the inlay in paper, and the result of measuring the resistance of the inlay, which was manufactured, to point pressure.

Figure 16A:
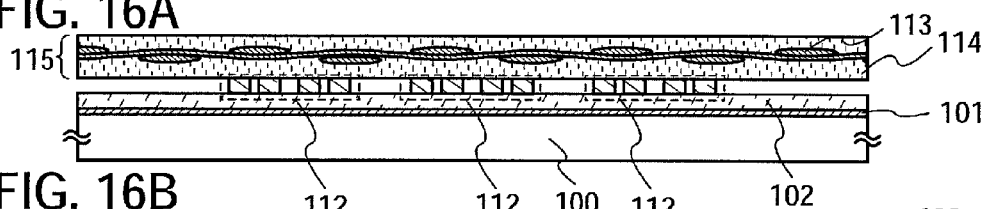
FIGS. 16A to 16H are cross-sectional views illustrating a manufacturing method of a semiconductor device of the present invention.

As shown in FIG. 16A, a separation layer 101 was formed over a substrate 100, and an element layer 102 including a semiconductor element formed using a non-single crystal semiconductor layer and an antenna 112 were formed over the separation layer 101. Then, a structure body 115 in which a fibrous body 113 is impregnated with an organic resin 114 was provided over the element layer 102 and the antenna 112. The structure of the element layer 102 is described with reference to FIG. 3A.

Here, as the substrate 100, a glass substrate manufactured by Corning Incorporated was used. As the separation layer 101, a tungsten layer with a thickness of 50 nm was formed by sputtering a tungsten target with the use of an argon gas, and a surface of the tungsten layer was treated with dinitrogen monoxide plasma to oxidize the surface of the tungsten layer, so that a tungsten oxide layer was formed.

Then, as an insulating layer 103 serving as a buffer layer, a silicon oxynitride layer with a thickness of 600 nm was formed by a plasma CVD method. As a source gas at this time, $SiH_4$, $H_2$, $NH_3$, and $N_2O$ at a flow ratio of 12:1200:150:200 were used.

As an insulating layer 104 serving as a base layer, a silicon nitride oxide layer with a thickness of 50 nm and a silicon oxynitride layer with a thickness of 100 nm were formed in this order by a plasma CVD method over the insulating layer serving as a buffer layer. As a source gas at this time, $SiH_4$, $H_2$, $NH_3$, and $N_2O$ at a flow ratio of 15:1200:150:20 were used for the silicon nitride oxide layer, and $SiH_4$ and $N_2O$ at a flow ratio of 1:120 were used for the silicon oxynitride layer.

After an amorphous silicon layer was formed by a plasma CVD method over the insulating layer 104, hydrogen included in the amorphous silicon layer was removed by heating at 650° C. for one minute to ten minutes. Then, the amorphous silicon layer was crystallized by irradiation with a pulsed laser beam, so that a crystalline silicon layer was formed. The irradiation conditions of a laser beam here were set as follows: frequency of 80 MHz; a second harmonic of a $YVO_4$ laser (wavelength: 532 nm); scanning speed of a laser beam of greater than or equal to 300 cm/sec and less than or equal to 400 cm/sec; and power of the laser beam of greater than or equal to 15 W and less than or equal to 25 W.

Then, a resist mask was formed by a photolithography process over the crystalline silicon layer, and the crystalline silicon layer was selectively etched using the mask, so that a crystalline semiconductor layer was formed. As an etching gas at this time, $CF_4$ and $O_2$ at a flow ratio of 51:30 were used. After that, the resist mask was removed.

Then, as an insulating layer serving as a gate insulating layer, a silicon oxynitride layer with a thickness of 20 nm was formed over the semiconductor layer by a plasma CVD method.

Then, over the insulating layer serving as a gate insulating layer, a tantalum nitride layer with a thickness of 30 nm was formed by sputtering a tantalum target with the use of an argon gas and a nitrogen gas, and then, a tungsten layer with a thickness of 170 nm was formed by sputtering a tungsten target with the use of an argon gas. It is to be noted that the tantalum nitride layer and the tungsten layer were formed in this order. Then, using a resist mask formed by a photolithography process, etching was performed with the use of $Cl_2$, $SF_6$, and $O_2$ at a flow ratio of 3:3:1, and then, etching was performed with the use of $Cl_2$, $SF_6$, $CF_4$, and $O_2$ at a flow ratio of 6:1:1:4. Further, the tantalum nitride layer was etched with the use of $Cl_2$ and $SF_6$ at a flow ratio of 1:1. In such a manner, a gate electrode was formed in which the tantalum nitride layer with a thickness of 30 nm and the tungsten layer with a thickness of 170 nm were stacked.

A resist mask was formed by a photolithography process over a semiconductor layer which was to be included in a p-channel thin film transistor later. A semiconductor layer which was to be included in an n-channel thin film transistor later was doped with phosphorus using the gate electrode as a mask. The impurity concentration of phosphorus at this time was set to $1\times10^{19}$ to $1\times10^{21}$ $cm^3$. After that, the resist mask covering a p-channel thin film transistor was removed.

A resist mask was formed by a photolithography process over a semiconductor layer which was to be included in an n-channel thin film transistor later. A semiconductor layer which was to be included in a p-channel thin film transistor later was doped with boron using the gate electrode as a mask. The impurity concentration of boron at this time was set to $1\times10^{19}$ to $1\times10^{21}$ $cm^3$. After that, the resist mask covering an n-channel thin film transistor was removed.

Then, over the gate electrode and the insulating layer serving as a gate insulating layer, insulating layers 106 and 107 were formed as an interlayer insulating layer. Here, as the insulating layer 106, a silicon oxynitride layer with a thickness of 50 nm was formed by a plasma CVD method. As a source gas at this time, $SiH_4$ and $N_2O$ at a flow ratio of 5:80 were used. As the insulating layer 107, a silicon nitride oxide layer with a thickness of 100 nm and a silicon oxynitride layer with a thickness of 600 nm were formed in this order by a plasma CVD method. As a source gas at this time, $SiH_4$, $H_2$, $N_2$, $NH_3$, and $N_2O$ at a flow ratio of 16:80:80:150:12 were used for the silicon nitride oxide layer, and $SiH_4$ and $N_2O$ at a flow ratio of 5:80 were used for the silicon oxynitride layer.

After the semiconductor layer was subjected to hydrogenation treatment by heating at 410° C. for one hour, part of each of the insulating layers 106 and 107 was selectively etched using a resist mask formed by a photolithography process, so that a source region and a drain region of the semiconductor layer were exposed. After that, the resist mask was removed.

Then, over the insulating layer 107, a titanium layer with a thickness of 100 nm was formed by sputtering a titanium target with the use of an argon gas, an aluminum layer with a thickness of 300 nm was formed by sputtering an aluminum target with the use of an argon gas, and then, a titanium layer with a thickness of 100 nm was formed by sputtering a titanium target with the use of an argon gas. It is to be noted that the titanium layer, the aluminum layer, and the titanium layer were formed in this order. Then, using a resist mask formed by a photolithography process, etching was performed with the use of $BCl_3$ and $Cl_2$ at a flow ratio of 7:1, and then, etching was performed with the use of $BCl_3$ and $Cl_2$ at a flow ratio of 15:3. In such a manner, wirings 108 and 109 were formed. After that, the resist mask was removed.

After composition in which a positive photosensitive polyimide resin was diluted with an organic solvent was applied over the wirings 108 and 109 and the insulating layer 107 and dried, light exposure was performed, and then, an uncured portion was removed by a developing solution and heating was performed at 320° C. for one hour. In such a manner, an insulating layer 111 was formed. It is to be noted that a polyimide resin was selectively exposed to light so that the wiring 109 would be exposed by the light exposure. Over the insulating layer 111, a titanium layer with a thickness of 100 nm was formed by sputtering a titanium target with the use of an argon gas, and an aluminum layer with a thickness of 700 nm was formed by sputtering an aluminum target with the use of an argon gas. Then, using a resist mask formed by a photolithography process, etching was performed with the use of $BCl_3$ and $Cl_2$ at a flow ratio of 7:1, and then, etching was performed with the use of $BCl_3$ and $Cl_2$ at a flow ratio of 15:3. In such a manner, an antenna 112 was formed. After that, the resist mask was removed.

Then, a structure body 115 with a thickness of 35 μm in which E glass fiber was used as a fibrous body was provided over the element layer 102 and the antenna 112, heating was performed at 100° C. under low pressure, and then, pressure was applied after exposure to atmospheric pressure. After that, heating was performed at 190 to 210° C. for one hour. In such a manner, a sealing layer 120 was formed over the element layer 102 and the antenna 112 as shown in FIG. 16B.

Figure 16B:
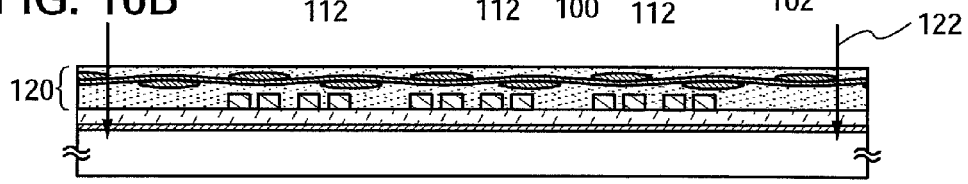
Figure 16C:
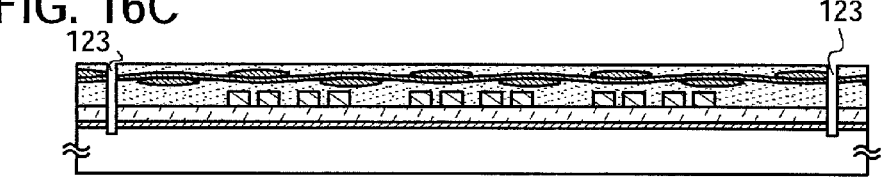

The separation layer 101 was irradiated with a laser beam 122 emitted from a carbon dioxide laser as shown in FIG. 16B, so that a groove 123 was formed in the element layer 102 and the structure body 115 as shown in FIG. 16C. Then, the substrate 100 having an insulating surface was soaked in water, so that the element layer 102 was separated from the separation layer 101.

A structure body with a thickness of 30 μm was provided on a separation surface of the separation layer 101 (specifically, a surface of the insulating layer 103 serving as a buffer layer) in a similar manner to the structure body 115, and heating and pressure bonding were performed, so that a sealing layer 125 was formed. The structure body includes a glass cloth using E glass which is high-strength fiber.

Figure 16D:
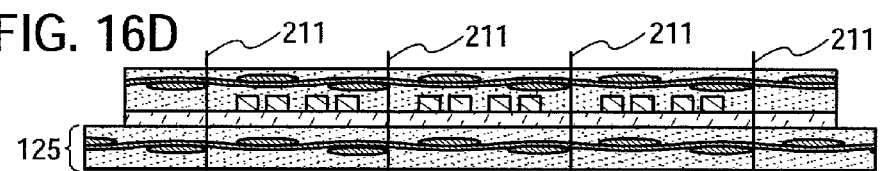
Figure 16E:
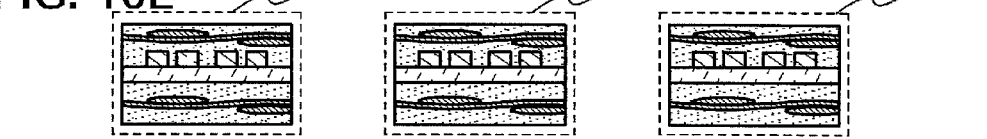
Figure 16F:
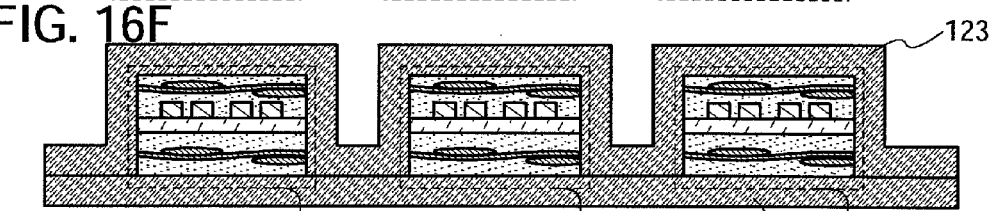

After that, irradiation with a laser beam 211 emitted from a carbon dioxide laser was performed as shown in FIG. 16D, so that a plurality of inlays 221a to 221c were formed as shown in FIG. 16E. The inlays 221a to 221c at this time each have a thickness of 75 μm.

The result of measuring the resistance of the inlays 221a to 221c to point pressure at this time is described below.

A compression testing apparatus was used as a measurement apparatus at this time, and a state of the inlay was measured in such a manner that an indenter was lowered at regular speed, and when a predetermined load was applied to the inlay, the indenter was raised. The indenter used here has a curved tip with a radius of curvature of 0.5 mm. In the case where pressure of 3 MPa was applied to the inlays 221a to 221c, the inlays were damaged at a rate of 0%. In the case where pressure of 6 MPa was applied to the inlays 221a to 221c, the inlays were damaged at a rate of 25%.

It is to be noted that as a comparative example, a similar test of measuring the resistance of an inlay to point pressure was performed on the inlay, which was manufactured in such a manner that an element layer 102 and an antenna 112 were formed through similar steps to the above-described inlay; an epoxy layer with a thickness of approximately 10 μm was formed over the element layer 102 and the antenna 112; and a PET film with a thickness of 6 μm was fixed to a surface of the epoxy layer and a surface of the element layer by an acrylic adhesive with a thickness of 4 μm. At this time, in the case where pressure of 3 MPa was applied to the inlays 221a to 221c, the inlays were damaged at a rate of 0%, and in the case where pressure of 6 MPa was applied to the inlays 221a to 221c, the inlays were damaged at a rate of 100%.

As seen from the above, it is found that in an inlay (a semiconductor device) in which a fibrous body is firmly fixed to a surface of an element layer as with the semiconductor device described in the present invention, the resistance to point pressure is improved and destruction by point pressure can be reduced.

Figure 16G:
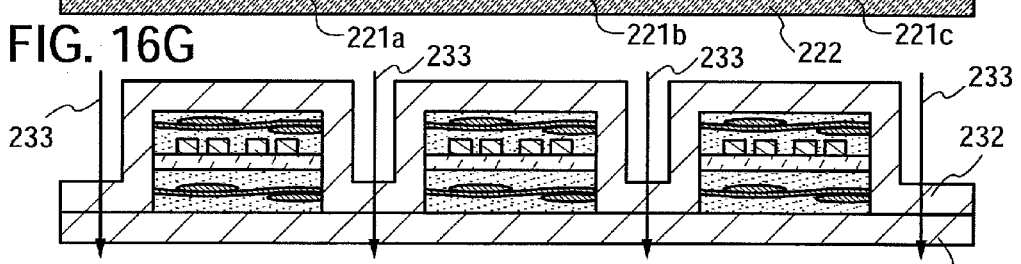
Figure 16H:
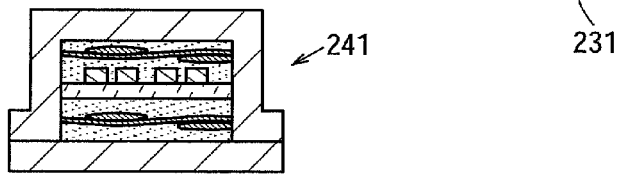

Paper including a semiconductor device can be formed by embedding the inlay in paper. In specific, a diluted solution of pulp in which paper had been dissolved was poured into a material loading portion having a hollow shape with the lower opening provided with a net. Pressure inside the material loading portion was reduced, whereby paper fiber was caught on the net and a wet paper was formed. The wet paper was detached from the net and was interposed between paperboards and pressure was applied, so that the thickness of the wet paper was made uniform. Then, the inlays 221a to 221c were disposed over a wet paper 222 with a uniform thickness, and a wet paper 223 was formed through similar steps to the wet paper 222. Then, pressure was applied to the wet papers 222 and 223 with a pressing machine, whereby pulp fiber in the wet papers 222 and 223 was tangled. After that, moisture included in the wet papers 222 and 223 was vaporized with a drying machine. In such a manner, papers 231 and 232 including the inlays 221a to 221c could be formed as shown in FIG. 16G.

After that, the papers 231 and 232 were divided into the appropriate size, whereby a paper including the inlay, that is, a semiconductor device 241 interposed between papers could be manufactured.

This application is based on Japanese Patent Application serial no. 2007-064051 filed with Japan Patent Office on Mar. 13, 2007, the entire contents of which are hereby incorporated by reference.

What is claimed is:
1. A semiconductor device comprising:
a first layer, the first layer comprising a first fibrous body impregnated with a first organic resin;
a semiconductor element over the first layer;
a second layer over the semiconductor element, the second layer comprising
a second fibrous body impregnated with a second organic resin; and
an antenna electrically connected to the semiconductor element, wherein the semiconductor element is sandwiched between the first layer and the second layer.

2. The semiconductor device according to claim 1, wherein the first organic resin comprises an epoxy resin, and
wherein the second organic resin comprises an epoxy resin.

3. The semiconductor device according to claim 1, wherein the semiconductor element comprises a non-single crystal semiconductor layer.

4. The semiconductor device according to claim 1, wherein the semiconductor element comprises a thin film transistor.

5. The semiconductor device according to claim 1, wherein the antenna is sandwiched between the first layer and the second layer.

6. The semiconductor device according to claim 1, wherein an area of a top surface of the semiconductor device is greater than or equal to 9 mm$^2$.

7. The semiconductor device according to claim 1,
wherein the first fibrous body is one of a woven fabric and an unwoven fabric, and
wherein the second fibrous body is one of a woven fabric and an unwoven fabric.

8. A book attached with the semiconductor device according to claim 1.

9. A semiconductor device comprising:
a first layer, the first layer comprising a first fibrous body impregnated with a first organic resin;
a semiconductor element over the first layer;
a second layer over the semiconductor element, the second layer comprising a second fibrous body impregnated with a second organic resin;
an antenna electrically connected to the semiconductor element;
wherein the semiconductor element is sandwiched between the first layer and the second layer,
wherein a thickness of a layer comprising the semiconductor element is greater than or equal to 1 μm and less than or equal to 10 μm,
wherein a thickness of the first layer is greater than or equal to 10 μm and less than or equal to 100 μm, and
wherein a thickness of the second layer is greater than or equal to 10 μm and less than or equal to 100 μm.

10. The semiconductor device according to claim 9,
wherein the first organic resin comprises an epoxy resin, and
wherein the second organic resin comprises an epoxy resin.

11. The semiconductor device according to claim 9, wherein the semiconductor element comprises a non-single crystal semiconductor layer.

12. The semiconductor device according to claim 9, wherein the semiconductor element comprises a thin film transistor.

13. The semiconductor device according to claim 9, wherein the antenna is sandwiched between the first layer and the second layer.

14. The semiconductor device according to claim 9, wherein an area of a top surface of the semiconductor device is greater than or equal to 9 mm$^2$.

15. The semiconductor device according to claim 9,
wherein the first fibrous body is one of a woven fabric and an unwoven fabric, and
wherein the second fibrous body is one of a woven fabric and an unwoven fabric.

16. A book attached with the semiconductor device according to claim 9.

17. A semiconductor device comprising:
a first layer, the first layer comprising a first fibrous body impregnated with a first organic resin;
a semiconductor element over the first layer;
a second layer over the semiconductor element, the second layer comprising a second fibrous body impregnated with a second organic resin;
an antenna electrically connected to the semiconductor element;
wherein the semiconductor element is sandwiched between the first layer and the second layer,
wherein a thickness of a layer comprising the semiconductor element is greater than or equal to 1 μm and less than or equal to 10 μm,
wherein a thickness of the first layer is greater than or equal to 10 μm and less than or equal to 100 μm,
wherein a thickness of the second layer is greater than or equal to 10 μm and less than or equal to 100 μm,
wherein the first fibrous body is woven fabric comprising a bundle of fibers for warp and a bundle of fibers for yarn, and
wherein the second fibrous body is woven comprising a bundle of fibers for warp and a bundle of fibers for yarn.

18. The semiconductor device according to claim 17,
wherein the first organic resin comprises an epoxy resin, and
wherein the second organic resin comprises an epoxy resin.

19. The semiconductor device according to claim 17, wherein the semiconductor element comprises a non-single crystal semiconductor layer.

20. The semiconductor device according to claim 17, wherein the semiconductor element comprises a thin film transistor.

21. The semiconductor device according to claim 17, wherein the antenna is sandwiched between the first layer and the second layer.

22. The semiconductor device according to claim 17, wherein an area of a top surface of the semiconductor device is greater than or equal to 9 mm$^2$.

23. A book attached with the semiconductor device according to claim 17.

* * * * *